US006829056B1

(12) United States Patent
Barnes et al.

(10) Patent No.: US 6,829,056 B1
(45) Date of Patent: Dec. 7, 2004

(54) MONITORING DIMENSIONS OF FEATURES AT DIFFERENT LOCATIONS IN THE PROCESSING OF SUBSTRATES

(76) Inventors: Michael Barnes, 12215 Santa Teresa Dr., San Ramon, CA (US) 94583; John Holland, 1565 Calaveras Ave., San Jose, CA (US) 95126; Hongqing Shan, 1369 S. Stelling Rd., Cupertino, CA (US) 95014; Bryan Y. Pu, 3064 Rosato Ct., San Jose, CA (US) 95135; Mohit Jain, 4754 San Tropico Ct., San Jose, CA (US) 95135; Zhifeng Sui, 41706 Covington Dr., Fremont, CA (US) 94539; Michael D. Armacost, 6577 Springpath La., San Jose, CA (US) 95120; Neil E. Hanson, 1610 Nantucket Cir., #117, Santa Clara, CA (US) 95014; Diana Xiaobing Ma, 19600 Kilt Ct., Saratoga, CA (US) 95070; Ashok K. Sinha, 4176 Hubbartt Dr., Palo Alto, CA (US) 94306; Dan Maydan, 12000 Murietta La., Los Altos Hills, CA (US) 94022

( * ) Notice: Subject to any disclaimer, the term of this patent is extended or adjusted under 35 U.S.C. 154(b) by 0 days.

(21) Appl. No.: 10/646,943

(22) Filed: Aug. 21, 2003

(51) Int. Cl.[7] .............................................. G01B 11/14
(52) U.S. Cl. ........................ 356/625; 118/708; 118/728; 118/719
(58) Field of Search ................................. 356/625, 628, 356/630, 634–636; 118/728, 500, 708–712, 719; 156/345

(56) References Cited

U.S. PATENT DOCUMENTS

| 4,611,919 A | 9/1986 | Brooks, Jr. et al. |
| 4,842,683 A | 6/1989 | Cheng et al. |
| 4,867,841 A | 9/1989 | Loewenstein et al. |

(List continued on next page.)

FOREIGN PATENT DOCUMENTS

| EP | 0410442 | 7/1990 |
| EP | 0702392 | 3/1996 |
| EP | 0810630 | 12/1997 |
| JP | 189928 | 9/1985 |
| JP | 61241930 | 10/1986 |
| JP | 072121 | 4/1987 |
| JP | 1248520 | 10/1989 |
| JP | 3281780 | 12/1991 |

(List continued on next page.)

OTHER PUBLICATIONS

US 6,150,664, 11/2000, Su (withdrawn)
Zhang et al., "Automated Process Control of Within–Wafer and Wafer–to–Wafer Uniformity in Oxide CMP", CMP–MIC, Mar. 2002.
Nanometrics Applications Note, "Optical Measurement of Critical Dimensions", Aug. 2001.

Primary Examiner—Gregory J. Toatley, Jr.
Assistant Examiner—Sang H. Nguyen
(74) Attorney, Agent, or Firm—Janah & Associates; Joseph Bach

(57) ABSTRACT

A substrate processing apparatus has a chamber having a substrate support, gas distributor, gas energizer, and gas exhaust port. A process monitor is provided to monitor features in a first region of the substrate and generate a corresponding first signal, and to monitor features in a second region of the substrate and generate a second signal. A chamber controller receives and evaluates the first and second signals, and operates the chamber in relation to the signals. For example, the chamber controller can select a process recipe depending upon the signal values. The chamber controller can also set a process parameter at a first level in a first processing sector and at a second level in a second processing sector. The apparatus provides a closed control loop to independently monitor and control processing of features at different regions of the substrate.

19 Claims, 13 Drawing Sheets

U.S. PATENT DOCUMENTS

| | | | |
|---|---|---|---|
| 4,924,807 A | 5/1990 | Nakayama et al. | |
| 4,931,135 A | 6/1990 | Horiuchi et al. | |
| 4,935,661 A | 6/1990 | Heinecke et al. | |
| 4,953,982 A | 9/1990 | Ebbing et al. | |
| 4,960,488 A | 10/1990 | Law et al. | |
| 4,980,204 A | 12/1990 | Fujii et al. | |
| 5,070,814 A | 12/1991 | Whiffin et al. | |
| 5,084,126 A | 1/1992 | McKee | |
| 5,244,501 A | 9/1993 | Nakayama et al. | |
| 5,252,178 A | 10/1993 | Moslehi | |
| 5,269,847 A | 12/1993 | Anderson et al. | |
| 5,372,673 A | 12/1994 | Stager et al. | |
| 5,389,197 A | 2/1995 | Ishimaru | |
| 5,405,488 A | 4/1995 | Dimitrelis et al. | |
| 5,427,878 A | 6/1995 | Corliss | |
| 5,453,124 A | 9/1995 | Moslehi et al. | |
| 5,522,934 A | 6/1996 | Suzuki et al. | |
| 5,532,190 A | 7/1996 | Goodyear et al. | |
| 5,556,521 A | 9/1996 | Ghanbari | |
| 5,589,002 A | 12/1996 | Su | |
| 5,592,358 A | 1/1997 | Shamouilian et al. | |
| 5,614,026 A | 3/1997 | Williams | |
| 5,624,498 A | 4/1997 | Lee et al. | |
| 5,653,808 A | 8/1997 | MacLeish et al. | |
| 5,683,517 A | 11/1997 | Shan | |
| 5,683,548 A | 11/1997 | Hartig et al. | |
| 5,720,818 A | 2/1998 | Donde et al. | |
| 5,767,628 A | 6/1998 | Keller et al. | |
| 5,772,771 A | 6/1998 | Li et al. | |
| 5,814,153 A | 9/1998 | Ishikawa | |
| 5,819,434 A | 10/1998 | Herchen et al. | |
| 5,882,417 A | 3/1999 | van de Ven et al. | |
| 5,910,011 A | 6/1999 | Cruse | |
| 5,913,102 A | 6/1999 | Yang | |
| 5,963,329 A | 10/1999 | Conrad et al. | |
| 5,976,308 A | 11/1999 | Fairbairn et al. | |
| 5,980,686 A | 11/1999 | Goto | |
| 5,997,950 A | 12/1999 | Telford et al. | |
| 6,001,267 A | 12/1999 | Os et al. | |
| 6,012,478 A | 1/2000 | Park | |
| 6,015,465 A * | 1/2000 | Kholodenko et al. | 118/719 |
| 6,090,210 A | 7/2000 | Ballance et al. | |
| 6,108,189 A | 8/2000 | Weldon et al. | |
| 6,113,984 A | 9/2000 | MacLeish et al. | |
| 6,159,297 A * | 12/2000 | Herchen et al. | 118/708 |
| 6,170,428 B1 | 1/2001 | Redeker et al. | |
| 6,179,924 B1 | 1/2001 | Zhao et al. | |
| 6,185,839 B1 | 2/2001 | Kholodenko et al. | |
| 6,303,507 B1 | 10/2001 | Wang et al. | |
| 6,333,272 B1 | 12/2001 | McMillin et al. | |
| 6,350,390 B1 | 2/2002 | Liu et al. | |
| 6,364,957 B1 * | 4/2002 | Schneider et al. | 118/728 |
| 6,388,253 B1 | 5/2002 | Su | |
| 6,403,491 B1 | 6/2002 | Liu et al. | |
| 2002/0188417 A1 | 12/2002 | Levy et al. | |
| 2003/0011786 A1 | 1/2003 | Levy et al. | |

FOREIGN PATENT DOCUMENTS

| | | |
|---|---|---|
| JP | 5047707 | 2/1993 |
| JP | 6124909 | 5/1994 |
| JP | 6132223 | 5/1994 |
| WO | 9619825 | 6/1996 |
| WO | 9800576 | 1/1998 |
| WO | 9957747 | 11/1999 |

* cited by examiner

MONITORING DIMENSIONS OF FEATURES AT DIFFERENT LOCATIONS IN THE PROCESSING OF SUBSTRATES

BACKGROUND

Aspects of the present invention relate to the monitoring and control of a substrate fabrication process.

Advances in electronic circuit technologies are requiring substrate features to have increasingly smaller or finer sizes, such as thinner interconnect lines and higher aspect ratios vias. Typically, the substrate is a semiconductor or dielectric substratum, that is processed to form features composed of dielectric, semiconducting and conducting materials, on the substrate. Small sized features allow packing of larger numbers of features into smaller areas and their operation at higher frequencies. For example, metal-containing interconnect lines are often being sized less than about 0.18 nm, and sometimes, even less than about 0.15 nm. However, it becomes increasingly difficult to fabricate such features with consistent dimensions and shapes across the substrate surface, especially as the features become ever smaller in size. In such fabrication process, unpredictable variations in process variables across the substrate surface can form features having different dimensions at different regions of the substrate surface. This makes it difficult to properly design a circuit or display, since the electrical or other properties of the features randomly vary across the substrate surface.

The problem of fabricating the fine features is all the more difficult when the features have tolerance ranges that are much smaller than those of conventional features. Variations in feature size or shape across the substrate that were previously acceptable for larger sized conventional features are longer no acceptable for the fine features. Feature shape variability is especially a problem when the critical dimensions of the features are those that vary across the substrate surface. The critical dimensions are those dimensions that significantly affect the electrical properties of the features. For example, the line width of interconnect lines is a critical dimension, because when a portion of an interconnect line is over-etched, the excessively thin portion has a higher resistance. Even a small change in dimension or sidewall taper angle of such an interconnect feature can result in out of tolerance electrical properties. As a result, many circuits having finely sized features are rejected for not meeting dimensional tolerance ranges as compared to conventional circuits.

Thus, it is desirable to be able to form finely sized features on a substrate that have consistent shapes and dimensions. It is further desirable to ensure that the features have uniform critical dimensions irrespective of their location on the substrate surface. It is also desirable to etch ultra fine features with good processing throughout and high yields.

SUMMARY

In one aspect of the invention, a substrate processing apparatus has a process chamber having a substrate support to receive a substrate, the substrate having first and second regions, a gas distributor to introduce a gas into the chamber, a gas energizer to energize the gas to form features on the substrate, and a gas exhaust port to exhaust the gas. The apparatus also has a process monitor to monitor a dimension of a pattern of spaced apart and discrete features being formed in the first region of the substrate and generate a first signal, and monitor a dimension of a pattern of spaced apart and discrete features being formed in the second region of the substrate and generate a second signal. The apparatus further has a chamber controller to receive the first and second signals and operate the substrate support, gas distributor, gas energizer, or gas exhaust port, to set process parameters including one or more of a gas flow rate, gas pressure, gas energizing power level, and substrate temperature, to process the features in the first and second regions to compensate for any differences in the dimensions of the features being formed in the first and second regions.

A version of a method of processing a substrate includes placing a substrate in a process zone, the substrate having first and second regions, introducing a process gas into the process zone, energizing the process gas to form a pattern of spaced apart and discrete features on the substrate and exhausting the process gas. A dimension of a pattern of spaced apart and discrete features being formed in the first region of the substrate is monitored and a first signal is generated. A dimension of a pattern of spaced apart and discrete features being formed in the second region of the substrate is also monitored and a second signal is generated. The first and second signals are evaluated and process parameters in the process zone are set to process the features in the first and second regions to compensate for any differences in the dimensions of the features, the process parameters including one or more of a gas flow rate, gas pressure, gas energizing power level, and substrate temperature.

In another aspect of the invention, a substrate etching apparatus has an etching chamber having a substrate support to receive a substrate, the substrate having a central region exposed to a first processing sector of the chamber and a peripheral region exposed to a second processing sector of the chamber, a gas distributor to introduce an etching gas into the chamber, a gas energizer to energize the etching gas to etch features on the substrate, and a gas exhaust port to exhaust the etching gas. The substrate etching apparatus also has a first light detector to detect light reflected from features being etched at the central region of the substrate and generate a first signal proportional to a measured dimension of the features, and a second light detector to detect light reflected from features being etched at the peripheral region of the substrate and generate a second signal proportional to a measured dimension of the features. A chamber controller receives and evaluates the first and second signals and operates the etching chamber to set a process parameter at a controllable first level in the first processing sector, the first level being selected in relation to the first signal, and the process parameter at a controllable second level in the second processing sector, the second level being selected in relation to the second signal, thereby providing independent monitoring and control of the dimensions of the features being etched at the central and peripheral regions of the substrate.

A version of a substrate etching method includes placing a substrate in a process zone, the substrate having a central region exposed to a first processing sector of the chamber and a peripheral region exposed to a second processing sector of the chamber, introducing an etching gas into the process zone, energizing the etching gas to etch features on the substrate, and exhausting the etching gas. Light reflected from features being etched at the central region of the substrate is detected and a first signal proportional to a critical dimension of the features is generated. Light reflected from features being etched at the peripheral region of the substrate is also detected and a second signal proportional to a critical dimension of the second features is generated. The first and second signals are evaluated and the chamber is operated to set a process parameter at a controllable first level in the first processing sector, the first level being selected in relation to the first signal, and the process parameter at a controllable second level in a second processing sector, the second level being selected in relation to the second signal, thereby providing independent monitoring and control of the critical dimensions of the features at the central and peripheral regions of the substrate.

In yet another aspect, a substrate etching apparatus has a chamber having a substrate support to receive a substrate, the substrate having first and second regions, a gas distributor to introduce an etching gas into the chamber, a gas energizer to energize the etching gas to etch features in the substrate, and a gas exhaust port to exhaust the etching gas. The etching apparatus also has a first light detector to detect light reflected from features in the first region of the substrate and generate a first signal proportional to a dimension of the features, and a second light detector to detect light reflected from the second region of the substrate and generate a second signal proportional to a dimension of the features. A chamber controller evaluates the first and second signals and selects an etching process recipe in relation to the first and second signals, and operates the chamber according to the etching process recipe, whereby the etching of the features at the first and second regions is independently monitored and controlled.

Another method of etching a substrate includes placing a substrate in a process zone, the substrate having first and second regions, introducing an etching gas into the process zone, energizing the etching gas to etch features on the substrate, and exhausting the etching gas. Light reflected from features in the first region of the substrate is detected and a first signal is generated. Light reflected from features in the second region of the substrate is also detected and a second signal is generated. The first and second signals are evaluated and an etching process recipe is selected in relation to the first and second signals. Process parameters in the chamber are set according to the etching process recipe, whereby etching of the features at the first and second regions is independently monitored and controlled.

DRAWINGS

These features, aspects, and advantages of the present invention will become better understood with regard to the following description, appended claims, and accompanying drawings which illustrate exemplary features of the invention:

FIG. 2b is an illustrative block diagram of the hierarchical control structure of a computer readable program of the chamber controller of FIG. 2a;

Figures 1A, 1B:
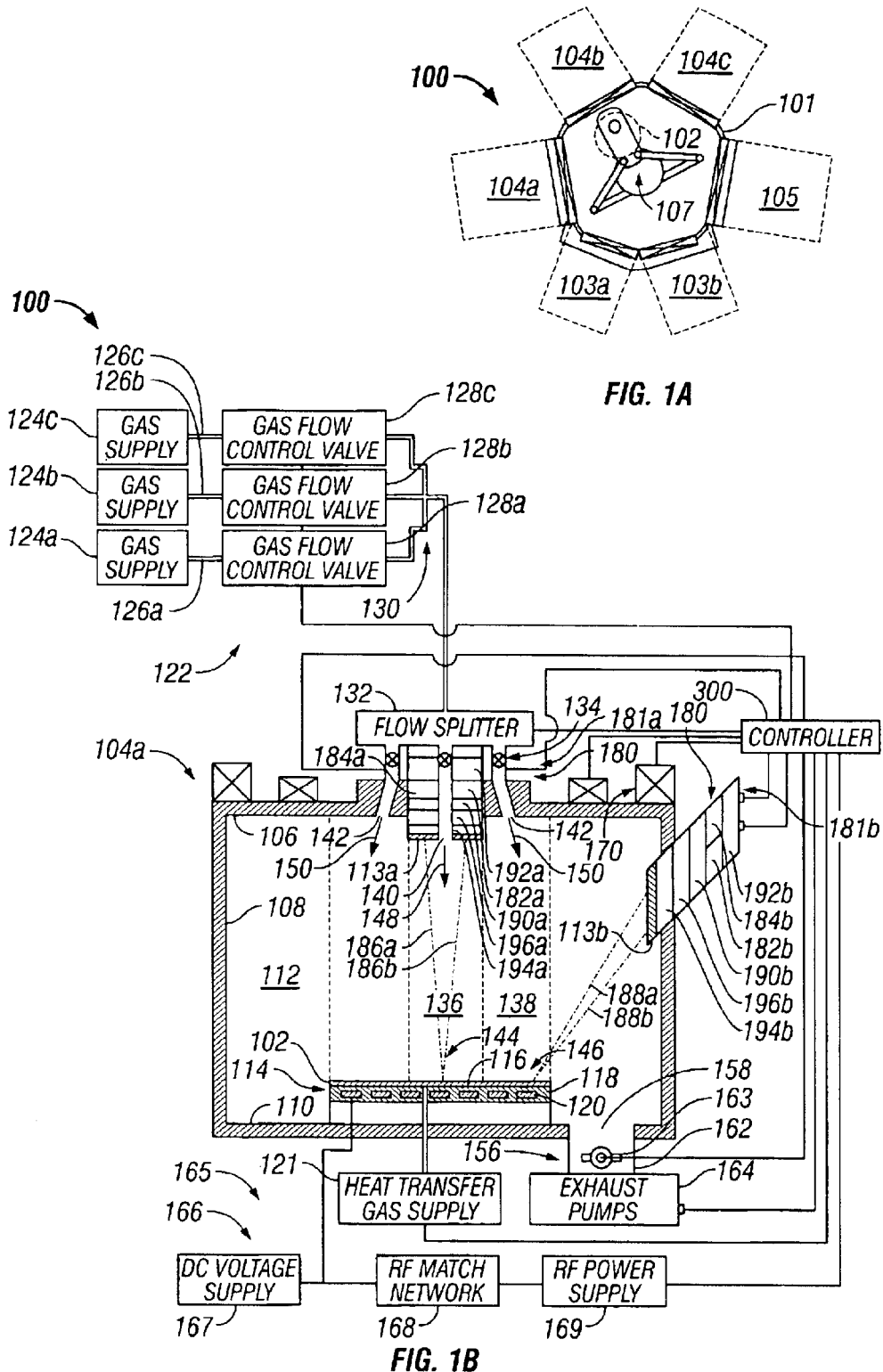
FIG. 1a is a schematic sectional top view of a substrate processing apparatus showing a platform with load-lock chambers, process chambers, and a measurement chamber.
FIG. 1b is a sectional side view of a process chamber having a process monitor and a chamber controller.
Figure 1C:
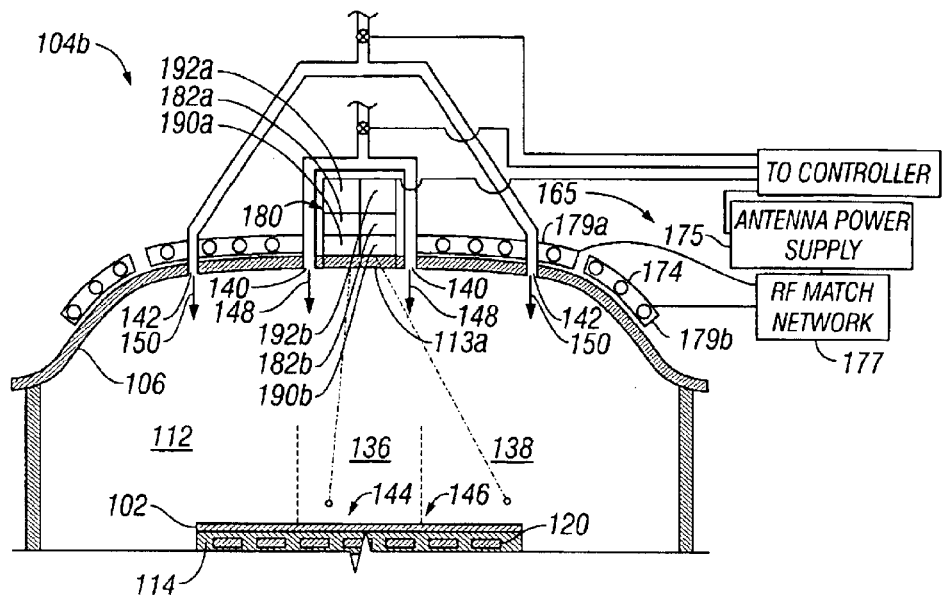
FIG. 1c is a sectional side view of a portion of a chamber having a gas energizer comprising an antenna and a centrally located process monitor on the ceiling.
Figure 1E:
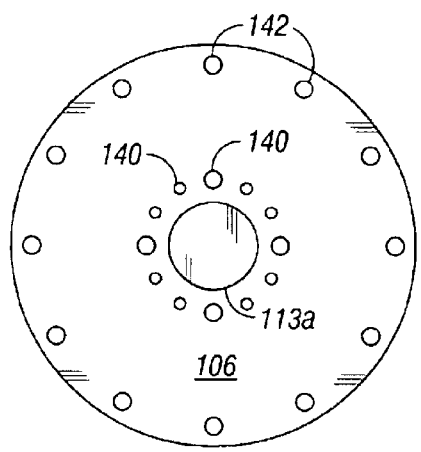
FIG. 1e is a bottom view of the gas distributor of FIG. 1c showing concentric central and peripheral gas outlets.
Figure 1D:
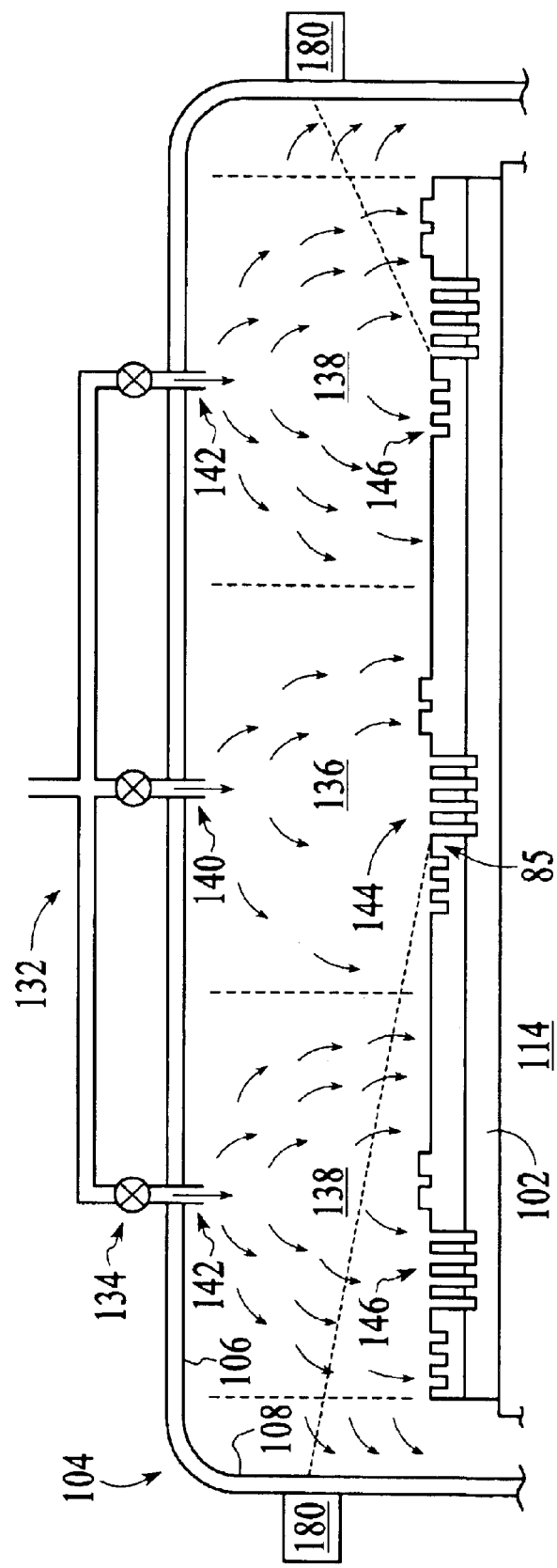
FIG. 1d is a schematic sectional side view of a portion of a process chamber having a substrate to be processed showing similar features in different regions of the substrate.
Figure 1F:
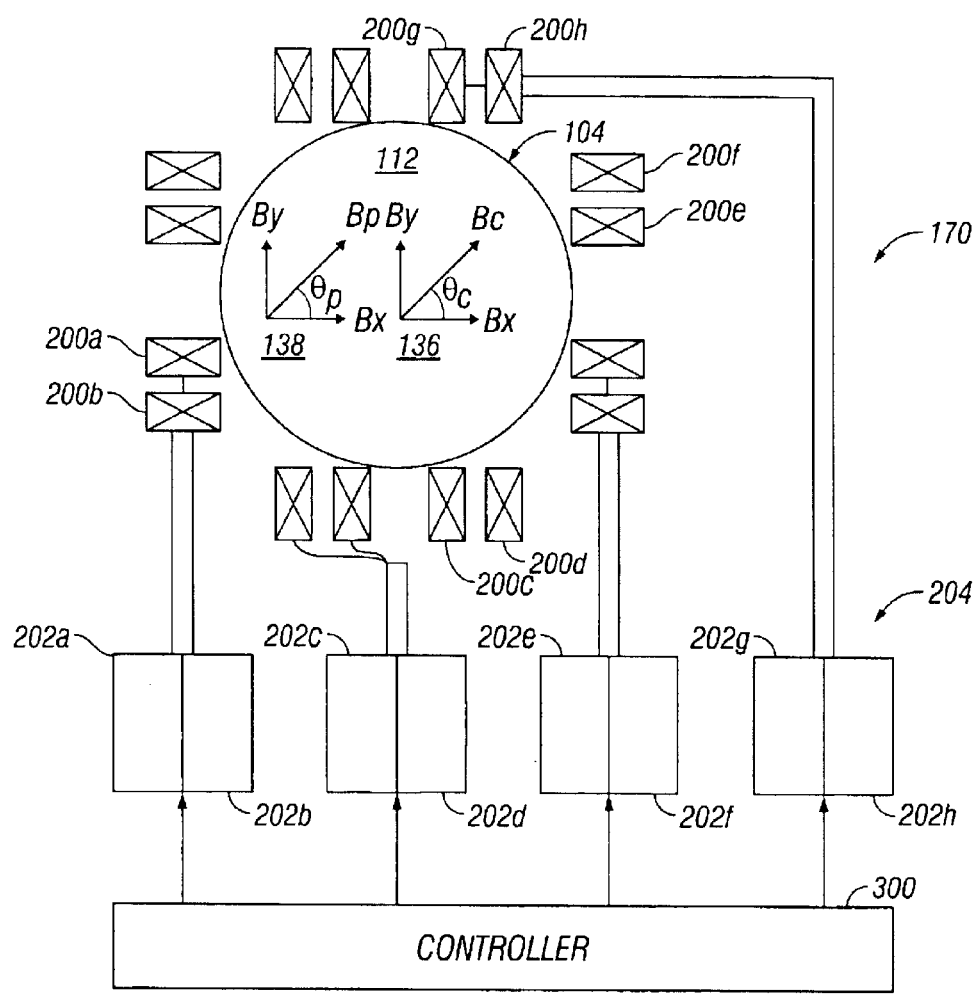
FIG. 1f is a schematic diagram of the magnetic field generator of the chamber of FIG. 1b.
Figure 1G:
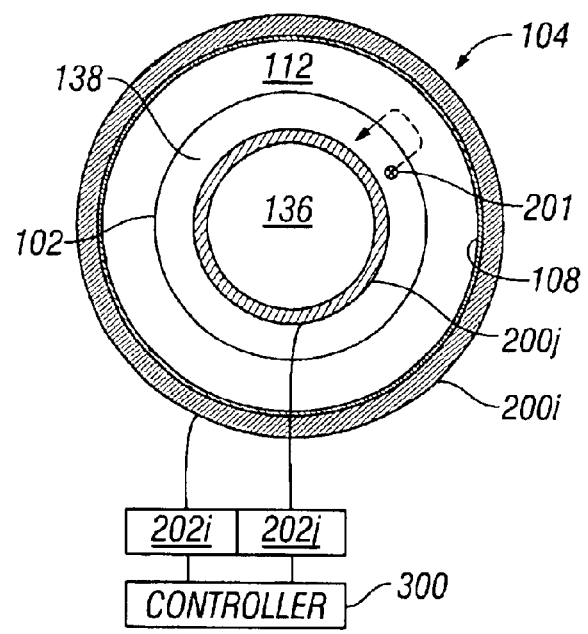
FIG. 1g is a schematic diagram of another embodiment of a magnetic field generator suitable for the chamber of FIG. 1b.
Figure 1H:
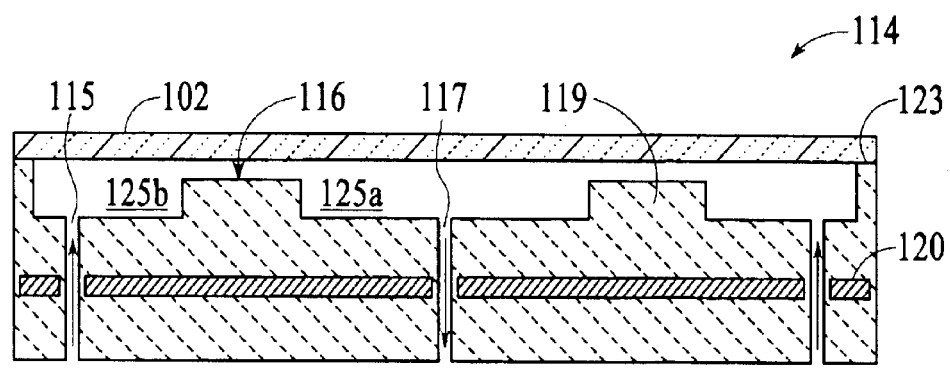
FIG. 1h is a schematic diagram of a side view of substrate support having dual heat transfer gas pressure zones.
Figure 1I:
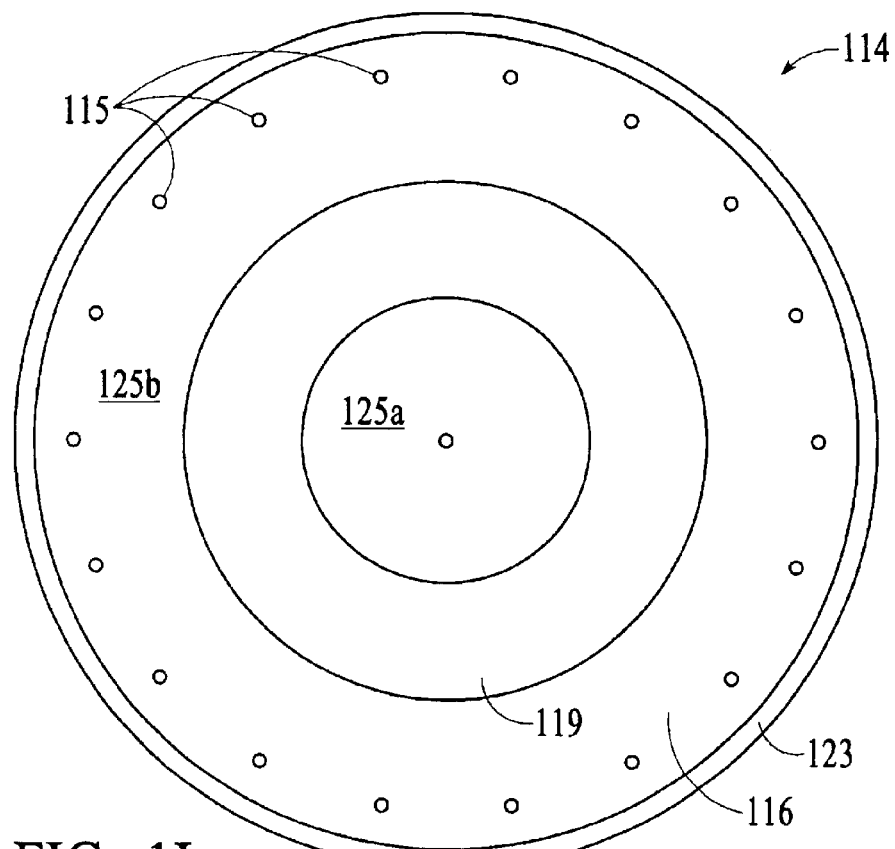
FIG. 1i is a schematic diagram of a top view of the substrate support of FIG. 1h.
Figure 8A:
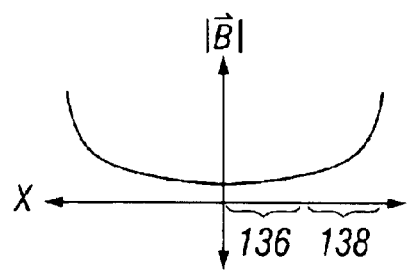
Figure 8B:
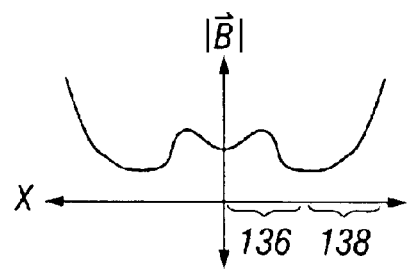
Figure 8C:
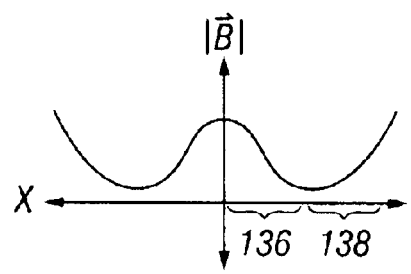
Figure 9:
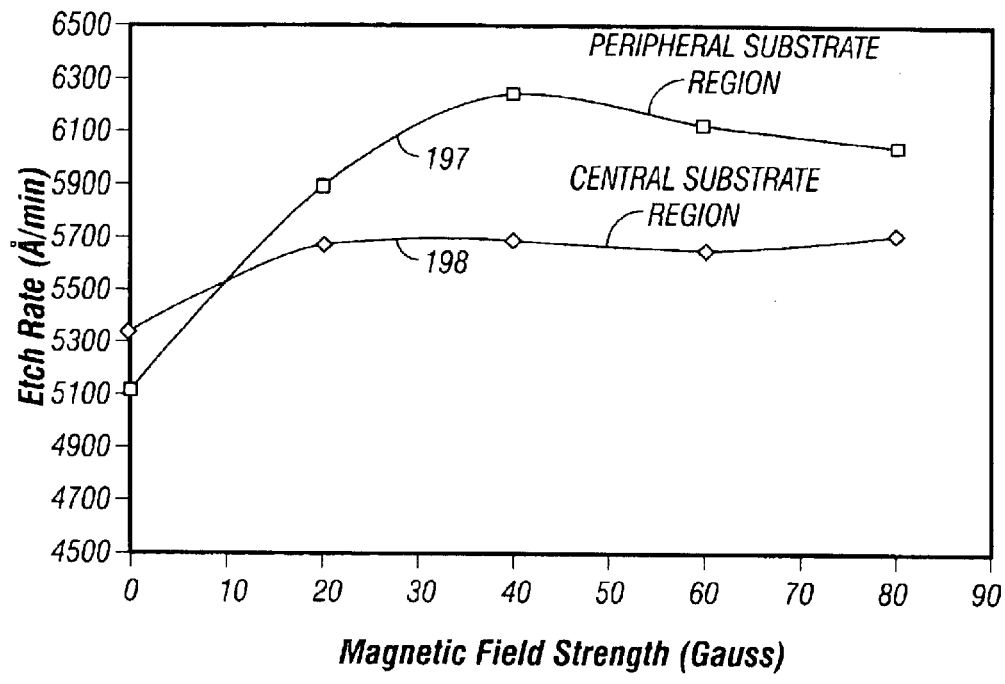
Figure 10:
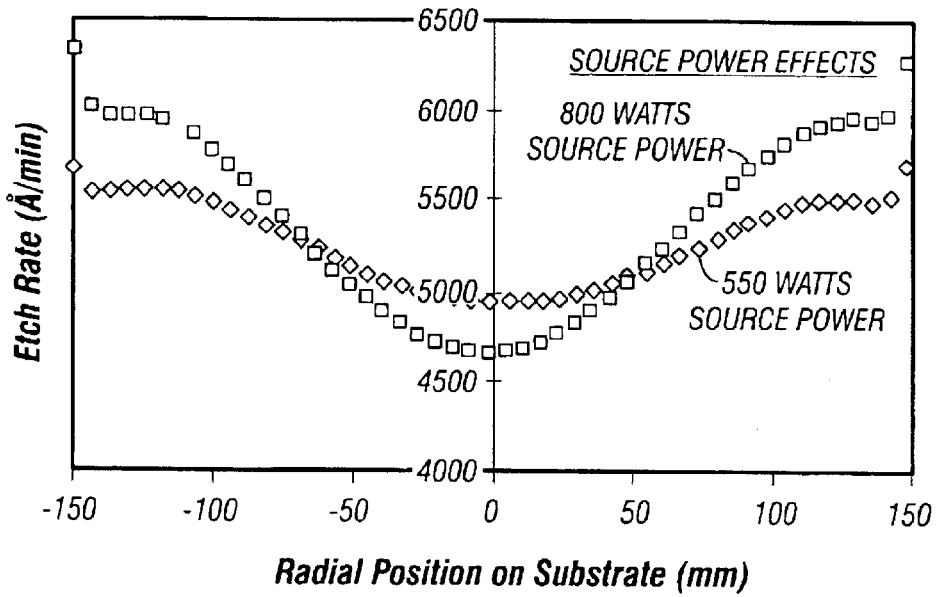
Figure 11:
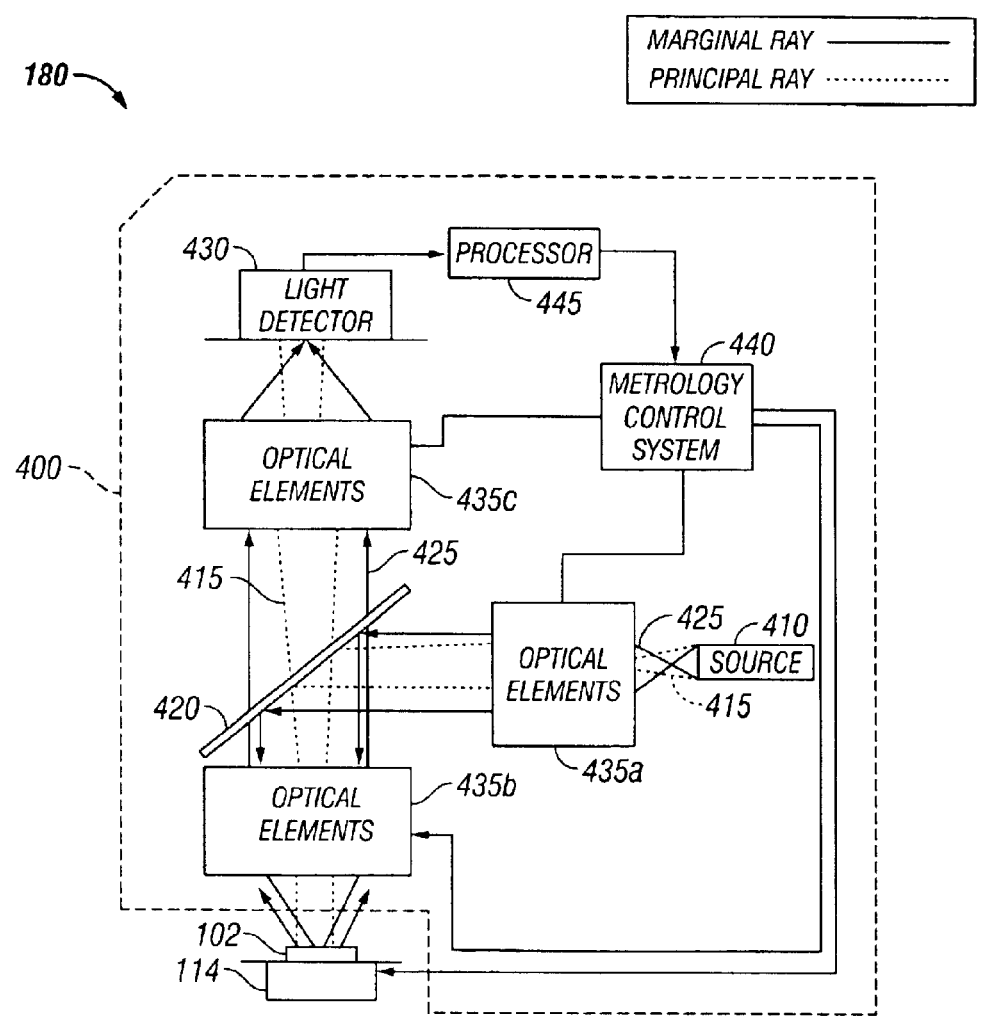

FIGS. 8a–c are graphs plotting magnetic field strength produced by the magnetic field generator of FIG. 1g, as a function of radial position above the substrate;

FIG. 9 is a graph of plots showing the variations in etching rates at the central and peripheral regions of the substrate achieved for different magnetic field strengths;

FIG. 10 is a graph of plots showing the variation in feature etch rates obtained by adjusting the source power levels of the current applied to an inductor antenna; and FIG. 11 is a schematic diagram of a metrology tool to measure the dimensions of the features being processed on the substrate.

DESCRIPTION

According to an exemplary embodiment, a substrate processing apparatus 100, as illustrated in FIGS. 1a–d, includes a process chamber 104a–c for processing a substrate 102 and a process monitor 180 to monitor features 85 at different locations on substrate 102. The apparatus 100 is useful for processing substrates, such as semiconductor wafers and displays, is provided to illustrate the invention; however, it should not be used to limit the scope of the invention or its equivalents. Generally, the apparatus 100 comprises a platform 101 having electrical connections and plumbing for load lock chambers 103a,b, substrate processing chambers 104a–c, and a measurement chamber 105, as is illustrated in FIG. 1a. The load lock chambers 103a,b are provided to receive cassettes containing batches of substrates 102. The substrates 102 are transferred from the load lock chambers 103a,b to the substrate processing chambers 104a–c by a robot arm 107. The substrates 102 are successively processed in the processing chambers 104-c, which may be, for example, etching, deposition, annealing, or cleaning chambers. The measurement chamber 105 is used to make measurements on individual substrates from a batch of substrates, such as for example, the first or initial substrate from the batch. While different chambers are described, the apparatus 100 is not limited to a particular set or arrangement of chambers and may have only a single chamber.

The process chamber 104a has enclosure walls comprising a ceiling 106, sidewall 108, and bottom wall 110, that define a processing sector 112 to maintain an energized gas about the substrate 102, as shown in FIG. 1b. The ceiling 106 or sidewalls 108 of the chamber 104 can have one or more windows 113a,b that allow radiation, such as light, to pass through. A substrate support 114 has a substrate receiving surface 116 to receive a substrate 102 transported into the processing sector 112 by the robot arm 107. In one version, the support 114 comprises a dielectric 118 that at least partially covers an electrode 120 that is chargeable to generate an electrostatic charge to electrostatically hold the substrate 102. A heat transfer gas supply 121 may be used to provide a heat transfer gas such as helium to the backside of the substrate 102.

Process gas, such as for example, an etching gas capable of etching material on the substrate 102, is introduced into the chamber 104 through a gas distributor 122. The chamber 104 also comprises a gas exhaust 156 to exhaust gas from the chamber 104 and to set a pressure of the gas in the chamber 104. The exhaust 156 comprises an exhaust port 158 about the substrate support 114 that leads to an exhaust line 162 that conveys the gas to the exhaust pumps 164. A throttle valve 163 in the exhaust line 162 controls the flow of gas out of the chamber 104. The pumps 164 typically include roughing and high vacuum-type pumps.

A gas energizer 165 couples RF or microwave energy to the process gas to energize the gas in the processing sector 112 of the chamber 104 or in a remote zone (not shown) outside the chamber 104. In one version, the gas energizer 165 comprises a pair of electrodes, with one electrode 120 being in the support 114 and the other being formed by the sidewall 108 or ceiling 106 of the chamber 104. An electrode power supply 166 applies an RF power to the electrode 120 via an RF power supply 169 and RF match network 168 while the walls 106, 108 are maintained at a ground or floating potentials; and optionally, a DC voltage supply 167 is provided to apply a DC voltage to the electrode 120 to generate electrostatic charge to hold the substrate 102. In another version, the gas energizer 165 comprises antenna 174 that is powered by an antenna power supply 175 via an RF match network 177, as shown in FIG. 1c. The antenna 174 may comprise inductor coils 179a,b that cover the ceiling 106 of the chamber 104 and generate an induction field in the chamber 104 to energize the gas in the chamber. In this chamber 104, the ceiling 106 is made from a dielectric material such as aluminum oxide, to allow inductive energy from the antenna to permeate therethrough; and can also be made of a semiconductor material, such as silicon, to serve as an electrode that couples to the electrode 120 in the chamber 104. The gas energizer 165 can also be both an electrode 120 and an antenna 174 that are used together. Optionally, the chamber 104 can also comprise a magnetic field generator 170, as shown in FIG. 1f, to shape, mix or confine the energized gas, as further described herein.

The process monitor 180 is set up to monitor a dimension of features 85 in a first region 144 of the substrate 102 and generate a first signal, and to monitor a dimension of features 85 in a second region 146 of the substrate 102 and generate a second signal. The features 85 are discrete structures that are separated from one another by distinct spaces, such as raised mesas or troughs in the substrate 102, which are arranged in a repetitive pattern to form an array of the feature structures, for example as schematically illustrated in FIG. 1d. The measured feature dimensions include a width, depth, opening size, or taper angle of each feature 85. For example, the measurable dimensions of features 85 such as vias or contact holes can be an opening size, depth or aspect ratio. The measurable dimension of an interconnect lines is typically the line width, height, or thickness of the feature. Typically, each measurement represents an average value for a small number of individual separate features 85, but the measurements can also be of individual single features 85. Other discrete features 85, such as n or p-doped sites can also be measured in terms of dopant concentration levels, type, or coverage area.

The dimensions of the features 85 being formed on the substrate 102 are monitored at least two different locations 144, 146 on the substrate 102. The measurement locations across the substrate 102 can be chosen, for example, in relation to the variations that are empirically determined by processing test substrates 102 to determine where features variations occurred across the substrate 102. For example, in certain etching processes, when features 85 etched at a first central region 144 of the substrate 102 are found to have a different shape than the features 85 etched in a second peripheral region 146 of the substrate 102 from the actual measurements of processed substrates, the process monitor 180 is set up to measure the dimensions of the features 85 at the central and peripheral location 144, 146 of the substrate 102. However, the measurements may also be made at other positions across the substrate 102, for example, at opposing edges of the substrate, such as substrate edges that lie near gas ingress or and egress points in the chamber 104. The process monitor 180 can also be adapted to measure features 85 at multiple grid points across the substrate 102, such as at the intersection points of a grid comprising horizontal and vertical lines that covers the area of the substrate 102. Locations with similar attributes, for example, a series of locations about, for example, the periphery of the substrate 102 can also be measured and the signals averaged to generate a single signal, such as for example, for the annular region abutting the substrate periphery.

The signals generated by the process monitor 180 are sent to a chamber controller 300 that operates the chamber 104 to form a closed control loop capable of adjusting processing conditions in the chamber 104 in response to the signals from the process monitor 180. The chamber controller 300 receives the feature dimension signals from the process monitor 180, evaluates them, and sends control signals to operate the chamber 104 to set process conditions in the chamber 104a,b to achieve desired feature attributes across the substrate 102, such as a controlled or improved dimensional uniformity of the features 85 being formed at different regions across the substrate 102. In the signal evaluation process, the chamber controller 300 can determine appropriate process conditions in the chamber 104a,b from a look-up table or by mathematically computing the desirable process conditions from the first and second signal levels received from the process monitor 180.

In one embodiment, the chamber controller 300 operates the chamber components to set process parameters to different levels at different processing sectors 136, 138 within a process zone 112 of a chamber 104 directly in relation to the magnitude of the feature measurement signals. The process conditions within processing sectors 136, 138 determine how features 85 in that particular region of the substrate 102 are processed. For example, the chamber controller 300 can receive the first and second signals and set process parameters in the chamber 104a,b that process the features 85 in the first and second regions to compensate for any differences in the dimensions of the features 85. The processing sectors 136, 138 are adjacent portions of the process zone 112 in which different processing conditions may be set. For example, a first processing sector 136 can be located above a first region 144 of the substrate 102 and a second processing sector 138 can be located above a second region 146 that is concentric to, and radially outward of, the first region 144. In this version, the first region 144 is a central portion and the second region 146 is a peripheral portion of the substrate 102. As another example, the first region 144 can be located near a gas ingress point in the chamber 104a,b, such as about outlets 142 of the gas distributor 122, and the second region 144 located about a gas egress point, such as about a gas exhaust port 158.

In each processing sector, the chamber controller sets a selected process parameter at a particular level. The localized levels of the process parameters within the smaller processing sectors 136, 138, can be independently set to discrete or different values to control processing attributes of the features 85 of the substrate 102 exposed to the energized gas in the particular processing sector 136, 138. For example, a localized process parameter can comprise a gas flow rate or velocity; a substrate temperature of a region of the substrate 102 located within the bounds of the sector, such as an inner or outer annular region of a substrate 102; a gas energizing power level applied to the gas energizer 165 that can independently energized the gas at a particular level in the sector relative to other sectors; or an average magnetic field strength within a sector in the chamber 104. By setting the process parameters at different levels in each processing sectors 136, 138, the processing of features 85 at different regions 144, 146 of the substrate 102 can be independently controlled to maintain predefined first and second processing rates or to achieve pre-selected levels of processing. For example, processing of the features 85 can be controlled so that the features 85 at different regions 144, 146 across the substrate 102 over the course of processing develop substantially the same dimensions or achieve desirable levels of differences in attributes. For example, the chamber controller 300 can set the localized process parameter at a controllable first level in the first processing sector 136 in the chamber 104a,b to process the features 85 in the first region 144 of the substrate 102 at a first processing rate, and to simultaneously process the features 85 in the second region 146 at a second processing rate by setting the localized process parameter at a controllable second level in the second processing sector 138, such that the features 85 end up with the same dimensions, or a defined difference in dimensions, at the termination of processing.

In another embodiment, the chamber controller 300 selects a particular process recipe from a stored look-up table which contains a plurality of process recipes. The selected process recipe corresponds to particular sets of first and second signal levels detected by the process monitor 180 for the dimensions of the features 85 at the different substrate regions 144, 146. Each process recipe can be tailored to equalize process characteristics at the two measurement regions 144, 146 so that features 85 are etched to have substantially the same dimensions or a controlled difference in dimensions. Each recipe can include particular predefined levels of substrate temperature, gas composition, gas flow rates through different gas outlets, gas energizer power levels, or magnetic field strengths. In one version, for example, the process recipe uses a gas composition that increases processing rates of the features 85 at the first region 144 of the substrate 102 over the other region 146 to equalize processing rates at the termination of the process.

The look-up table has sets of first and second signal levels, or a mathematical operand of the first and second signals, that are associated with a process recipe containing a set of process parameter levels. For example, each table entry may be an ordered set of numbers, the first two numbers being values of the first and second signal levels and the third number being the number of an associated process recipe. In another example, the look-up table may contain an ordered set comprising a first number that is a mathematical operand of the first and second signals, e.g., the ratio of the first signal and second signal levels, the difference between the first and second signal levels, or some other algebraic relationship between the first and second signal levels; and the second being the associated process recipe number that contains a set of process parameter levels.

A process recipe may also be selected based on measurements of a single substrate 102 from a batch of substrates that are being processed. For example, when a cassette of substrates (not shown) is loaded in a load-lock chamber 103a,b, the robot 107 may select a first substrate 102 and transfer the selected substrate to the measurement chamber 105. The dimensions of features 85 or the attributes of different regions 144, 146 of the substrate 102 are measured in the measurement chamber 105 using for example, a process monitor 180 such as a metrology tool 400. Signals corresponding to these measurements are passed to the chamber controller 300, which then selects a process recipe from a look-up table that has suitable process parameters to process the batch of substrates 102 in the cassette which have the same measured attributes. For example, if the measured dimension of the features 85 were bigger than average, the process recipe would have process conditions that remedy the problem by excessive etching of the features 85, or vice versa. These measurements can also be made between process steps on a single substrate, by removing the substrate 102 from a process chamber 104 and passing it to the measurement chamber 105 for measurements, and then returning it to the process chamber 104 for further processing in processing conditions according to a process recipe selected based on the measurement signals.

In another embodiment, the chamber controller 300 changes the process parameters in the chamber 104 from initializing process parameters used in the processing of an initial substrate, to batch process parameters for the processing of a batch of substrates similar in attributes to the initial substrate. In this version, an initial or first substrate is taken from a batch of substrates in the substrate cassette and transferred to the chamber 104 for processing. Before and after processing, or during processing, the dimensions of features 85 in more than one region of the substrate 102 are measured and the resultant dimension measurements correlated to the dimensions measured at the different regions after processing of the substrate is completed. The original difference in dimensions of the features 85 in different substrate regions and/or the change in dimensions of the features 85 at the different regions after processing is evaluated by the chamber controller to determine a particular set of batch process parameters or a process recipe from a look-up table to reduce the difference in dimensions at the conclusion of processing for subsequent substrates. The other substrates of the batch, which are similar in attributes to the initial substrate, are then processed to the determined process recipe or batch process parameters to further reduce variations in critical dimensions of the features 85 at the different regions across the subsequent substrates in the batch. This method allows compensation for process variations or anomalies from one batch of substrates to another batch.

Process Monitor

Different versions of the process monitor will be detailed. In one version, the process monitor 180 comprises a plurality of interferometers 181a,b that detect light, such as visible or ultra-violet light, that is reflected from features 85 being etched at the different regions 144, 146 of the substrate 102 to determine a state of the features 85 at each region at a given time, as shown in FIG. 1b. For example, a first interferometer 181a has a first light source 184a that directs a first light beam 186a toward a first central region of the substrate to generate a reflected light beam 186b that is received by the first detector 182a, which then generates a first signal in relation to the intensity of reflected light beam. A second interferometer 181b comprises a second light source 184b directs a second light beam 188a toward a second peripheral region 146 from which it is reflected to form the beam 188b that is received by a second detector 182b, which then generates a second signal. Each light source 184a,b can be a monochromatic light source, such as for example, a He—Ne or ND-YAG laser; or a polychromatic light source, such as a xenon or Hg—Cd lamp. The polychromatic light source may be filtered to provide a light beam having the selected wavelengths or a light filter can be placed in front of the detector. The interferometers 181a,b can also use light generated by the plasma in the chamber as the light source. The light detectors 182a,b typically comprise a light sensitive sensor, such as a photomultiplier, photovoltaic cell, photodiode, or phototransistor, that provides an electrical intensity signal in response to a measured intensity or phase of the reflected light beams 186b, 188b from the substrate 102. Focusing lenses 190a,b can be used to focus the light beams 186, 188 onto different spots on the substrate 102 or to focus reflected light back onto the light detectors 182a,b. Optionally, light beam positioners 192a,b, such as rotable mirrors, can be used to locate a suitable location on which to "park" the beam, direct reflected light onto the light detectors 182a,b, or scan the light beams 186a, 186b in a raster pattern across the substrate 102.

When the area of the features 85 being formed in the substrate 102 is relatively small compared to the surrounding areas that are not being processed, it is desirable to increase the signal to noise ratio of the measurements of the dimensions of the features 85. In one version, one or more light polarizers 196a,b are used to polarize the light before or after it is reflected from the substrate 102 to increase a signal to noise ratio of the reflected light signal from the substrate features 85, as for example disclosed in U.S. patent application Ser. No. 09/695,577, by Sui et al., entitled "Monitoring Substrate Processing Using Reflected Radiation," which is incorporated herein by reference in its entirety. The polarization angle relates to a principal orientation of the features 85, which is a primary direction of a majority of the features 85 being processed on the substrate 102, and can include a first polarization angle substantially parallel to the principal orientation and a second polarization angle substantially perpendicular to the principal orientation. The intensity of reflected light component having the substantially parallel polarization angle has a larger magnitude than reflected light components that are at other polarization angles. Thus measured parallel and other reflected light components are used to enhance the signal strength of the light reflected from the features 85 of interest relative to light reflected from other portions, such as from the resist portions or adjacent regions of the substrate 102, to increase the signal to noise ratio of the reflected light. The depth of a feature 85 being etched on the substrate 102 or the etch rate can be determined by monitoring the reflected polarized light. Thus, the etch depth of a feature 85 being formed on a substrate 102 may be determined by counting the minima or maxima of the signal resulting from the destructive/constructive interference of the reflected polarized light.

The interferometers 181a,b can also have filters 194a,b, such as bandpass filters, to selectively filter the signals generated by the light detectors 182a,b to increase the relative intensity of a selected passband of frequencies or wavelengths of the signals in relation to the intensity of other frequency components of the reflected light. The passband can be related to an intensity modulation frequency of the reflected light from the features 85 being formed on the substrate 102 to reduce the intensity of any light signal that is not reflected from other portions of the substrate 102. The bandpass filter can be an optical signal processor, such as a coated lens or material, or an electrical signal processor such as a digital signal processor that digitizes a light signal received from the light detectors 182a,b and filters the digitized signal. In one version, the passband range is selected to provide a coherence length of a non-coherent light source, which may be, for example, a plasma emission having multiple wavelengths and phases. The coherence length is the length in which interference effects of light from the light source can be observed. In one version, the passband range of the bandpass filter can be 1.5 nanometers for a plasma emission centered at about 254 nanometers.

In another version, the process monitor 180 comprises a plasma emission analyzer to measure a quantitative value of the feature dimensions from the changing emission spectra of the feature processing plasma. The plasma emission analyzer comprises a first detector 182a that detects light emitted from the plasma in the first zone 136 above a first portion 144 of the substrate 102, and a second detector 182b to detect light emitted from the plasma in the second processing sector 138 above a second portion 146 of the substrate 102, as shown in FIG. 1c. Each light emission from a predefined plasma location is used to generate a separate signal, which may be outputted as different signals or as a combined signal. The plasma emission analyzer analyzes the emission spectra of different plasma regions to determine a change in the chemical composition or other attribute of the features 85 being formed at this region. The emissions spectra can change, for example, with etch through one layer and commencement of etching into another layer having a different chemical composition. Optionally, focusing lenses 190a,b can be used to focus the detectors 182a,b onto different spots in the plasma over the substrate 102 and light beam positioners 192a,b can be used to move the detection position of the detectors 182a,b or the direction of sight of the lenses 190a,b.

In yet another version, the process monitor 180 comprises a reflectometer (not shown) which directs a light beam onto the substrate 102 and detects the amplitude of the reflected beam, as for example disclosed in U.S. Pat. Nos. 6,462,817 and 6,297,880 which are incorporated herein by reference in their entirety. A reflectometer can be used to determine properties such as the thickness or index of refraction of features 85 being formed on the substrate 102. The reflectometer comprises a laser or other light source to direct a beam of light onto a portion of the substrate 102 and a light detector to measure the intensity of the reflected beam. The reflectometer may also comprise an adjustable filter to control the wavelength of the incident or reflected beam. Alternatively, the reflectometer may measure a band of wavelengths simultaneously. The reflectometer can also comprise a means to adjust the angle of incidence of the beam directed onto the substrate 102. In another version, the reflectometer may use a polarized incident light beam, and to this end may further comprise a polarizer and a phase retarder or modulator, as previously described. For example, when the reflectometer is used to determine the thickness of features 85 having a known wavelength-dependent index of refraction and an extinction coefficient of zero, the reflectometer uses unpolarized light at normal incidence and measures the ratio of the intensity of the reflected beam to the incident beam as a function of wavelength. From a plot of reflection intensity vs wavelength, and the known index of refraction, a thickness of the features 85 can be calculated using Maxwell's Equations. For example, in reflection from a single layer of features 85, the expected reflection intensity primarily depends on the index of refraction of the feature material (which is wavelength and angle dependent), and the thickness of the feature 85. Since the wavelength dependence of the index of refraction is known, and the angle of incidence is not varied, the collected data can be used to solve for the thickness of the features 85. In another version, the angle of incidence can be varied, as well as the polarization of the incident beam, to generate data that can be collected, for example the reflection intensity can now be measured as a function of angle and polarization, as well as of wavelength, and solved for complex layered features 85.

In yet another version, the process monitor 180 comprises an ellipsometer (not shown), which directs a polarized light beam onto the substrate 102 and detects both the change in the phase and magnitude of the reflected light beams from the substrate 102. The light beam is polarized into components parallel (p component) and perpendicular (s component) to the plane of incidence onto the substrate. The amplitude and phase of the ratio of the reflected s and p components are referred to as the ellipsometric parameters $\psi$ and $\Delta$ by mathematical equations that are known in the art. Examples of ellipsometers are disclosed in U.S. Pat. Nos. 3,874,797 and 3,824,017, both of which are incorporated herein by reference in their entireties.

In a further version, the process monitor 180 is a metrology tool 400 that monitors dimensions of features 85 being processed on a substrate in-situ in the process chamber 104 or in a measurement chamber 105 outside the process chamber 104 in a processing line of the substrate processing apparatus 100. The substrate 102 can be transferred from the process chamber 104 to the measurement chamber 105 where the substrate 102 is measured by the metrology tool 400. The metrology tool 400 can also be mounted in a separate chamber, such as the load-lock chamber 103a,b or the transfer chamber. The resulting metrology data from the substrate 102 is used to adjust the process parameters to improve processing of other substrates as described below. The metrology tool 400 measures a property of the substrate 102, such as a critical dimension (CD), line profile, or other shape characteristic of features 85 in the substrate 102, before or after processing of the substrate 102. An embodiment of a metrology tool 400, as illustrated in FIG. 11, comprises an optical measurement device capable of measuring topographical dimensions of the processed features 85, such as feature width, height, spacing, shape, or taper angle of the edge of the feature 85. For example, in one version, the metrology tool 400 is a diffractive line profilometer that directs a polarized, broadband light beam onto the substrate 102 and measures the resulting reflectively diffracted light beam to determine an average line profile of the features 85 in a targeted region 144, 146 of the substrate 102. The features 85 form a diffraction grating on the substrate 102. Typically, the features 86 are periodic within the region, such as an array of lines. The metrology tool 400 comprises a model of the periodic features 85 with tunable parameters that determine the shapes of the features 85. An initial profile estimate of the features 85 is entered into the metrology tool 400. The metrology tool 400 calculates the diffraction spectrum from this initial profile estimate, such as using Rigorous Coupled Wave Analysis (RCWA). A mismatch between the calculated diffraction spectrum and the detected diffraction spectrum is used to optimize the profile estimate using a non-linear regression algorithm. This optimization step is repeated until the calculated diffraction spectrum of the profile estimate is within a desired tolerance of the detected diffraction spectrum. Exemplary embodiments of a suitable metrology tool 400 that include a diffractive line profilometer are the NanoOCD models, fabricated by Nanometrics, Milpitas, Calif. An example of a method of diffractively determining a line profile of repeating features 85 in an area is further described in U.S. Pat. No. 5,963,329 to Conrad et al., which is hereby incorporated by reference in its entirety.

In another exemplary embodiment, the process monitor 180 can also be a scatterometer (not shown) capable of 2-Θ scatterometry, in which the intensity of the scattered light is measured as a function of the angle of incidence. Light is diffracted by periodic features 85 on the substrate 102 according to the grating equation: $\sin\theta_i + \sin\theta_r = m\lambda/d$, where $\theta_i$ is the angle of incidence, $\theta_r$ is the angle of reflection, m is the diffraction order, $\lambda$ is the wavelength of light, and d is the period of the pattern being evaluated on the substrate 102. For small values of the grating period, corresponding to small feature sizes, usually m=0, corresponding to angle of incidence equals angle of reflection, is the diffraction order most easily observed. In scatterometry, the incident or reflected light can also be polarized into s and p components to provide better measurements. Analysis of the data to determine properties of the substrate 102 being processed may involve either solving mathematical models based on collected data or the comparison of collected data to previously computed solutions to determine a best fit, for example by using algorithims that minimize the root mean square error (RMSE) between the observations and the solutions.

In the version shown in FIG. 11, the metrology tool 400 comprises a light source 410 to produce an incident light beam 415. A partially reflective mirror 420 diverts the incident light beam 415 toward the substrate 102 to illuminate the substrate 102 and generate a reflected light beam 425 that is reflected from the substrate 102. The reflected light beam 425 passes through the partially reflective mirror 420 and into a light detector 430 comprising a light-sensitive device. Optical elements 435a–c can be provided between the light source 410, partially reflective mirror 420, substrate 102, and light detector 430 to focus, aperture, stigmate, or otherwise modify the incident and reflected light beams 415, 425. For example, the optical elements 435a–c may comprise lenses and adjustable apertures. A metrology control system 440 may be provided to control the optical elements 435a–c and the substrate support 114 to make measurements of the substrate 102 with a desirably high precision. In one embodiment, the light detector 430 is adapted to measure multiple amplitudes across the frequency spectrum of the reflected light beam 425 to measure a critical dimension (CD) of a target feature of the substrate 102. For example, the light detector 430 may comprise a single light-sensitive electronic device such as an array of light-sensitive photoelectric sensor, for example a CCD detector. An image processor 445 receives the image from the light detector 430 and processes the image to determine the critical dimensions of features 85 on the substrate 102. Typically, image boundaries corresponding to topological features of the substrate 102 are digitally outlined by differentiating between ranges of intensity levels in the electronic image. The critical dimension of a target feature is calculated by measuring the distance between image boundaries corresponding to the edges of the target feature.

In another exemplary embodiment, the light detector 430 is adapted to determine a thickness of features 85 of the substrate 102 by spectroscopic ellipsometry. Upon entering the light detector 430, the reflected light beam 425 has a polarization angle that is detected to calculate the change in thickness of the features 85. For example, the polarization angle of the reflected light beam 425 can be determined for the substrate 102 when features 85 have a first thickness. Subsequently, the polarization angle of the reflected light beam 425 can be determined for the substrate 102 when the features 85 have a second thickness. The difference between the first and second thickness is calculated by dividing the change in polarization angle by a predetermined rate of change of the polarization angle along the propagation distance of the reflected light beam 425.

Controller

Figure 2A:
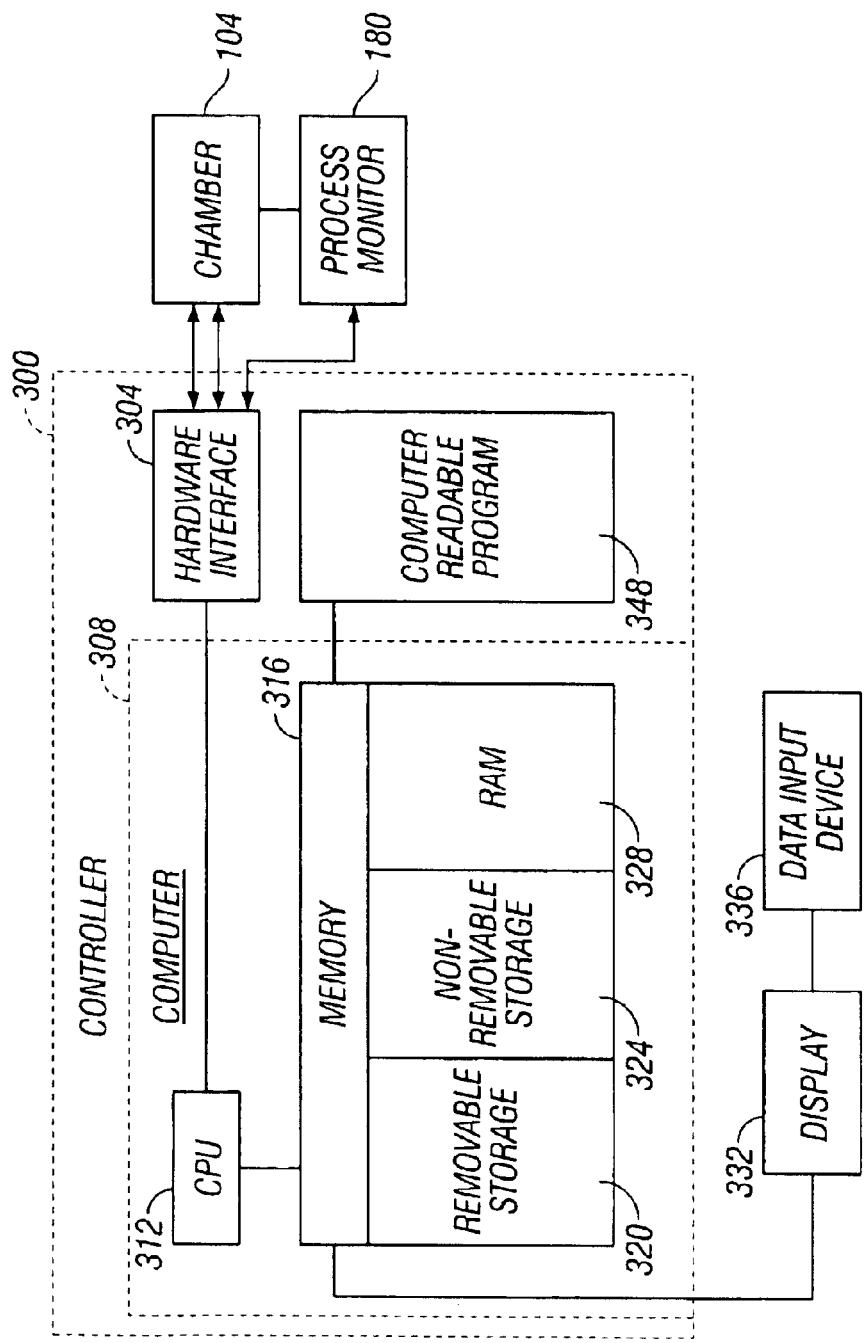
FIG. 2a is a schematic diagram of an embodiment of a chamber controller suitable for operating the process chambers of FIGS. 1a–1d.

Referring to FIG. 2a, typically, the chamber controller 300 comprises as a computer 308 having a central processing unit (CPU) 312, such as a Pentium processor commercially available from Intel Corporation, Santa Clara, Calif., coupled to a memory 316 and peripheral computer components. The memory 316 may include a removable storage 320, such as a CD or floppy drive; a non-removable storage 324, such as a hard drive; and random access memory (RAM) 328. The chamber controller 300 may further comprise a hardware interface 304 comprising analog or digital input and output boards, and motor controller boards. An operator can communicate with the chamber controller 300 via a display 332 or data input device 336. To select a particular screen or function, the operator enters the selection using the data input device 336, such as a keyboard or light pen.

Figure 2B:
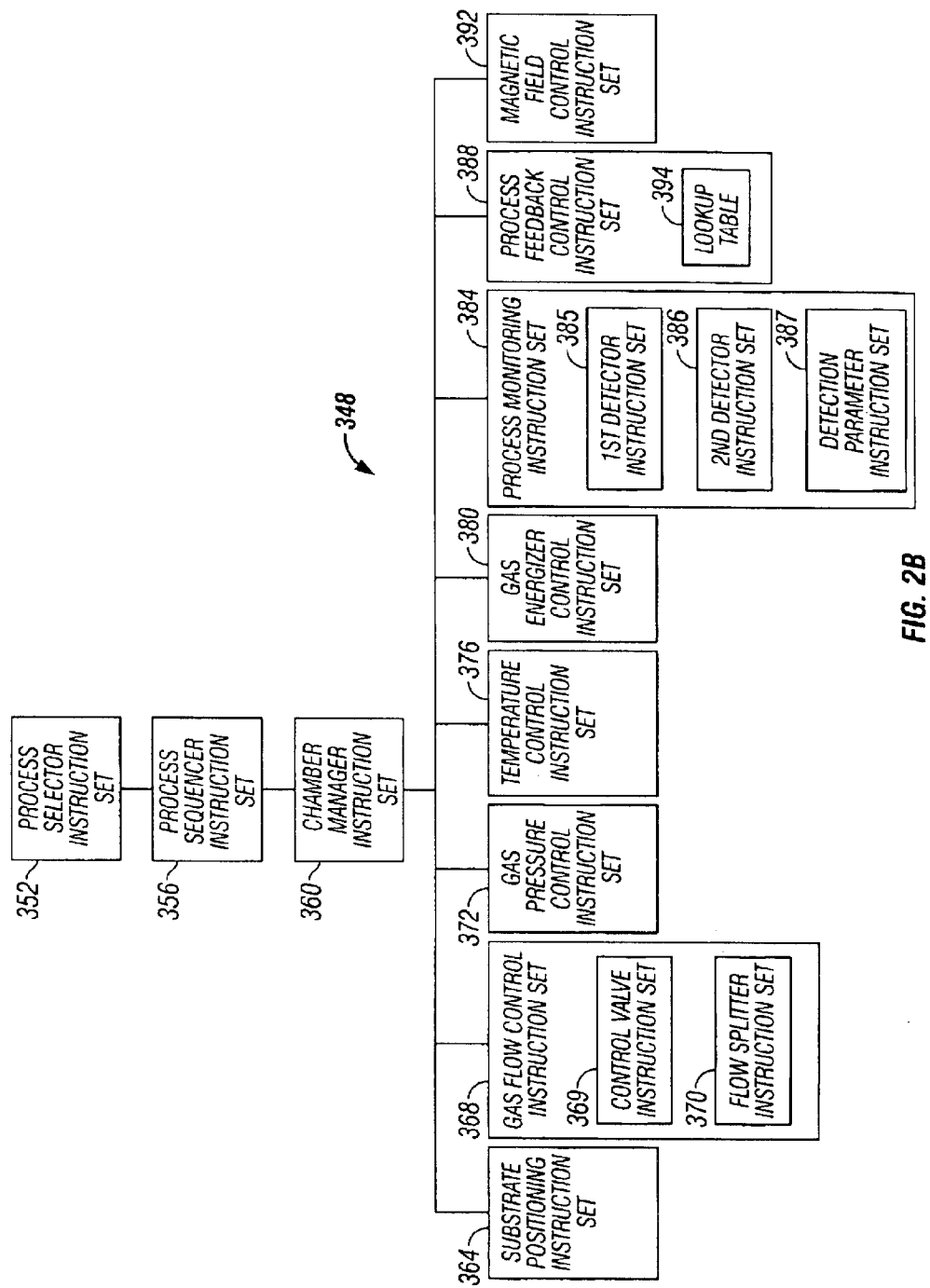

The chamber controller 300 also comprises a computer-readable program 348 stored in the memory 316, and comprising program code capable of controlling and monitoring the processes conducted in the chamber 104. The computer-readable program 348 may be written in any conventional computer-readable programming language. Suitable program code is entered into single or multiple files using a conventional text editor and stored or embodied in computer-usable medium of the memory 316. If the entered code text is in a high level language, the code is compiled, and the resultant compiler code is then linked with an object code of pre-compiled library routines. To execute the linked, compiled object code, the user invokes the object code, causing the CPU 312 to read and execute the code to perform the tasks identified in the program 348. An illustrative control structure of an embodiment of a computer-readable program 348 is shown in FIG. 2b.

Using the data input device 336, for example, a user enters a process parameter set and chamber number 104a,b into the computer-readable program 348 in response to menus or screens displayed on the display 332 that are generated by the process selector instruction set 352. A process sequencer instruction set 356 comprises program code to accept a chamber type and set of process parameters from the process selector 352 and time its operation. The process sequencer instruction set 356 initiates execution of the process set by passing the particular process parameters to a chamber manager instruction set 360 that controls multiple processing tasks in the chambers 104a,b. For example, the chamber manager instruction set 360 can include various chamber component instruction sets, such as:

(1) a substrate positioning instruction set 364 to control chamber components to load the substrate 102 onto the substrate support 114, and optionally, to lift the substrate 102 to a desired height in the chambers 104a,b;

(2) a gas flow control instruction set 368 to control the composition, flow rates through different gas outlets 140, 142, and velocities of the etching gas introduced into the chambers 104a,b;

(3) a gas pressure control instruction set 372 to control the pressure in the chamber 104 by regulating the opening size of the throttle valve 163;

(4) a temperature control instruction set 376 to control the temperatures at different regions 144, 146 of the substrate 102, by for example, operating a heater (not shown) in the support 114, flow rates of heat transfer gas, or radiant energy lamps (also not shown);

(5) a gas energizer control instruction set 380 to control the power level applied to a gas energizer 165 of the chambers 104a,b; and (6) a magnetic field control instruction set 392 to operate an optional magnetic field generator 170; and (7) a process monitoring instruction set 384 to monitor a process being conducted in the chamber 104; and (8) a process feedback control instruction set 388 to serve as a feedback control loop between the process monitoring instruction set 384 and other chamber component instruction sets.

While described as separate instruction sets for performing a set of tasks, each of these instruction sets can be integrated with one another or may be over-lapping; thus, the chamber controller 300 and the computer-readable program 348 described herein should not be limited to the specific version of the functional routines described herein.

The process monitoring instruction set 384 comprises, for example, (i) a first detector instruction set 385 to receive and/or evaluate a first signal generated by the first detector 182a from the light beam 186a reflected from the first region 144 of the substrate 102, and (ii) a second detector instruction set 386 to receive and/or evaluate a second signal generated by the second detector 182 from the light beam 188b reflected from a second region 146 of the substrate 102, to determine comparative information about the processing state at the different regions 144, 146. Each signal is evaluated to determine an attribute of the features 85 being processed in the substrate region from which the signal is generated. For example, when the process monitor 180 comprises interferometers 181a,b, the process monitoring instruction set 384 can count the number of interference fringes in each of the two signals; or compare the intensity of the signals in real-time to a stored characteristic waveforms, measured or calculated representative data patterns, or data stored in a look-up table. The process monitoring instruction set 384 can also comprise program code for controlling the light sources 184a,b; bandpass filters 194a,b, light beam positioners 192a,b, focusing lenses 190a,b, or light polarizers 196a,b.

The detection parameters instruction set 387 comprises code relating to the detection parameters, such as selected wavelengths; characteristic attributes of reflected or emissive light; timing data; predetermined numbers of interference fringes; the look-up table; algorithms for modeling the data; and other data types and patterns. The data parameters can be determined by processing test substrates having predetermined feature dimensions, one at a time, in the chambers 104a,b. For example, a series of traces of light reflected from features 85 having different dimensions on the substrate 102 and/or emitted from different regions of the plasma in the chamber 104 are recorded. The traces are evaluated to identify a recognizable detectable change in the trace, which is used as input and programmed into the detection parameters instruction set 387, in the form of an algorithm, look-up table, stored parameters, or other criteria suitable for evaluating the dimension of the features 85 being processed on the substrate 102.

The process feedback control instruction set 388 forms a feedback control loop between the process monitoring instruction set 384 and other chamber component instruction sets. The process feedback instruction set 388, in response to signals from the process monitoring instruction set 384, generates and sends signals to instruct the levels at different regions of the substrate 102. For example, the process feedback instruction set 388 can retrieve the look-up table from the memory 316 of the chamber controller 300 and identify a suitable recipe or sets of localized process parameter values for the chambers 104a,b from the look-up table that is associated with the values of the process monitoring signals received from the process monitoring instruction set 384. In another example, the chamber controller 300 can mathematically compute one or more localized process parameter levels from the first and second signal levels received from the process monitor 180.

Controlling Gas Flow to Regulate Feature Dimensions

In this example, the first and second signals of the dimensions of the features 85 being processed in the first and second regions 144, 146 of the substrate 102 and to control the gas flow rates of a process gas that is directed into the first and second processing sectors 136, 138. By setting two different localized gas flow rates, the chamber controller adjusts for any detected difference in feature dimensions at the different substrate regions 144, 146 to compensate for the dimensional differences.

In one version, the gas distributor 122 is connected to gas supplies 124a–c via conduits 126a–c having gas flow control valves 128a–c that are controlled to pass a desired gas composition to a mixing manifold 130, as shown in FIG. 1b. The mixing manifold 130 mixes the gases to form a process gas that is fed to a flow splitter 132 that divides the flow of gas between the different gas outlets 140,142 of a gas nozzle 134. The gas outlets 140,142 introduce the process gas at different flow rates ino the processing sectors 136,138 of the process zone 112 of the chamber 104 so that different gas flow rates are provided directly above different portions 144, 146 of the substrate 102. However, the gas outlets 140, 142 can also be positioned to direct the gas into other regions of the chamber 104 or substrate 102. The gas outlets 140, 142 can extend through the ceiling 106 (as shown), sidewall 108 or support 114 (not shown).

The gas distributor 134 also has a flow splitter 132 having a single input channel that receives premixed etching gas and a bifurcated valve leading to two output channels to generate two output gas streams of the same process gas for the central and peripheral gas outlets 140, 142. The bifurcated valve can simultaneously set both the first and second flow rates to first and second output channels. The single input channel provides more controllable ratio of flow rates through each output channel since the setting one flow rate automatically sets the other to the desired level without requiring calibration of two separate gas flow valves to one another. However, the flow splitter 132 can also have individual gas flow valves on separate conduits that lead from the mixing manifold 130 to the central and peripheral gas outlets 140, 142, respectively. The latter version allows individual control of each of the valves which is desirable when, for example, one of the flow rates need to be individually adjusted without changing the other flow rate.

The gas distributor 134 also has multiple gas outlets 140, 142 that are spaced apart and positioned to generate a non-uniform distribution of process gas into the chamber 104 to improve processing uniformity across the substrate 102. The arrangement of the gas outlets 140, 142 can be determined from gas flow modeling using computation fluid dynamics, or by experimental studies with test substrates. For example, central and peripheral gas outlets 140, 142 can be located to provide gas flow ingress points that generate concurrent but separate flow patterns of gas to different processing sectors 136, 138 to control the localized gas species distribution or gas residence time about the different regions 144, 146 of the substrate 102. The peripheral gas outlets 14Z are spaced apart along a ring that is radially outward from, and coaxial to, the central gas outlets 140, which are spaced apart along an inner circle, as shown in FIG. 1e. A window 113a is in the circle inside of the central gas outlets 140 to allow light to pass through for the process monitor 180. The gas outlets 140, 142 can also be positioned along the same radial line or can be positioned on alternating radial lines. In one version, the gas distributor 122 has 12 central gas outlets 140 and 12 surrounding peripheral gas outlets 142.

The gas outlets 140, 142 can also have different opening sizes selected to inject gas with different velocities. For example, the central gas outlets 140 can have an opening size set to provide a first gas velocity, and the peripheral gas outlets 142 another opening size to provide a second velocity of gas. In one embodiment, the opening sizes are selected to provide a first velocity that is at least about 1 time higher than the second velocity. The different velocities result in different residence times of each gas flow stream that generate a flow distribution in the chamber 104 that equalizes other non-controllable processing variables. For example, the higher gas velocity region can provide different etching attributes by replenishing the process gas species at a faster rate and thereby improving, for example, chemical reaction or isotropic etching attributes in the region, which would control the shape of the features 85 being processed at the region.

The gas outlets 140, 142 can also be adapted to direct gas along flow directions 148, 150 that are at different angles relative to one another. For example, the gas outlets 140 can be oriented to direct gas in a vertical direction 148 that is substantially perpendicular to the receiving surface 116 of the substrate support 114, as shown in FIG. 1c; or the gas outlets 142 can be oriented to direct gas at an angled flow direction 150 that is inclined to the receiving surface 116, as shown in FIG. 1b. The vertically oriented first flow direction of process gas provides a perpendicular gas stream on the central region 144 of the substrate 102 and the angled second flow direction provides an inclined gas stream over the peripheral region 146 of the substrate 102. The gas outlets 140, 142 can also direct the gas flow streams horizontal and parallel to the receiving surface 116 of the substrate support 114 (not shown). The difference in directed angles of the two gas streams can also control the flow rate and incidence angle of fresh process gas at each of the different regions 146, 148 of the substrate 102.

In this version, the process feedback control instruction set 388 of the chamber controller 300 transmits instructions to the gas flow control instruction set 368 to control the gas flow rates through the gas outlets 140, 142 in response to the first and second monitoring signals. The gas flow control instruction set 368 also comprises, for example, a control valve instruction set 369 that includes program code to set the positions of the gas flow control valves 128a–c of the different gas supplies 124a–c to obtain a particular process gas composition. The gas flow control instruction set 368 can also comprises a flow splitter instruction set 370 that has program code to adjust the flow splitter 132 to pass a first volumetric flow rate of process gas through the central gas outlets 140, 142 and a second volumetric flow rate of process gas through the peripheral gas outlets 140, 142 to obtain the desired volumetric flow ratio through one or both of the gas outlets 140, 142. For example, if a critical dimension of features 85 being etched on the substrate are reached at a faster rate at a first central region 144 of the substrate 102, relative to a second peripheral region 146, the process feedback control instruction set 388 instructs the gas flow control instruction set 368 to operate the flow splitter 132 to reduce a flow rate of etching gas passing through the central gas outlets 140 and increase a flow rate of etching gas passing through the peripheral gas outlets 142. In this manner, a process parameter comprising localized gas flow rates is controlled at the different processing sectors 136, 138 to control the attributes of the features 85 being etched at the different regions 144, 146 of the substrate 102. Similarly, the gas flow control instruction set 368 can operate the flow rates or an opening size of the gas outlets 140, 142 themselves, to control the velocity of gas passing through the outlets. The localized gas flow rates or velocities can also be set to match the attributes of features 85 being etched at the central and peripheral regions 144, 146 of the substrate 102 to obtain dimensions that are substantially identical, i.e., that vary by less than 5%, at both regions 144, 146.

In another example, the process feedback control instruction set 388 mathematically computes the localized process parameter levels from the first and second signal levels received from the process monitor 180. For example, for a first signal level of $S_1$, and a second signal level $S_2$, the value of a difference in first and second process gas flow rates $\Delta F$, can be calculated from the formula: $\Delta F = k(C_1 S_1 - C_2 S_2)$, where $C_1$, $C_2$, and k are experimentally determined constants to a particular process recipe and equation. The chamber controller 300 then uses $\Delta F$ to instruct the flow splitter instruction set 370 to set the opening position of the flow splitter so that a desired flow rates of process gas pass through each set of gas outlets 140, 142. The first and second flow rates may be set in relation to the first and second signals, so that the first flow rate is proportional in magnitude to the first signal level and the second flow rate is also proportional in magnitude to the second signal level. For example, when the features 85 being etched in the first region 144 of the substrate 102 are being etched too slowly relative to the features 85 at the second region 146 of the substrate 102, causing their critical dimensions to become different, the first flow rate is set at a higher level than the second flow rate to provide more etching gas at the first region 144 of the substrate 102 to reduce the variation in the etch rates and critical dimensions.

EXAMPLES

The following examples demonstrate process control of the etching dimensions of features 85 being etched at the different regions 144, 146 of the substrate 102 in a DPS-type chamber as partially illustrated in FIGS. 1c and 1e. A process monitor 180 comprising an interferometer was used to detect light that was reflected from the substrate 102 and passed through the window 113a located at the center of the ceiling 106. Etching gas was introduced into the chamber 104 either through (i) only the peripheral gas outlets 142, (ii) only the central gas outlets 140, or (iii) through both the central and peripheral gas outlets 140, 142 in different flow ratios. The central gas outlets 140 directed gas vertically into the chamber 104 at an angle of 0° relative to the normal to the plane of the substrate 102, and the peripheral gas outlets 142 directed etching gas at either an inclined angle of 45° or at an angle of 0° relative to the normal to the plane of the substrate 102. During the etching process, the chamber controller 300 sets the etching gas composition and flow rates through each of the different gas outlets 140, 142, in relation to signals received from the detectors of the process monitor.

The features 85 were etched in a blanket polysilicon layer on a silicon wafer using an etching gas comprising HBr and $HeO_2$ and optionally $Cl_2$; or $Cl_2$, $O_2$, and $N_2$. The main etch step was performed at a gas pressure of about 4 mTorr, and an etch finishing (soft landing) step was conducted at a higher pressure of about 30 mTorr. The antenna source power level was typically maintained at 200 to 800 Watts and the electrode bias power level at 40 to 400 Watts. After etching, the attributes of the etched features 85 was determined or confirmed using a scanning electron microscope (SEM).

Figure 3:
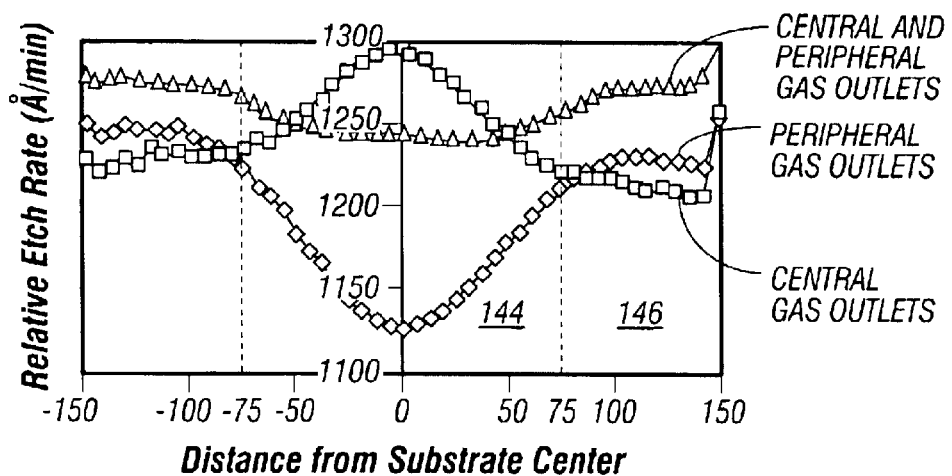
FIG. 3 is a graph of plots showing control of etching rates of features at different regions across a substrate by regulating process gas flow though central, peripheral, or both gas outlets.

FIG. 3 demonstrates that controlling the gas flow rates through the central and peripheral gas outlets 140, 142 provides more uniform etch rates for features 85 at different regions 144, 146 across the substrate diameter. The Y-axis shows the measured relative etch rate of features 85 etched along a line drawn across the substrate diameter from the center to opposing perimeters of the substrate 102. The X-axis represents distance from center across the diameter of a 300 mm substrate, where the 0 mm point represents the center of the substrate 102, the (−150 mm) point represents a first perimeter point, and the (150 mm) point represents the opposing perimeter. When etching gas was introduced through the peripheral gas outlets 142, the etch rate of the features 85 located at about the central region 144 of the substrate 102 was much slower and dipped downwards relative to the etch rate of the features 85 about the two opposing peripheral regions 146 of the substrate 102. Conversely, when the etching gas was introduced only through the central gas outlets 140, the etch rate of the features 85 at the central region 144 were higher than the etch rates at the peripheral region 146. When the gas flow was controllably applied through both the central and peripheral gas outlets 140, 142, the etch rate of features 85 at the central and peripheral regions 144, 146 of the substrate 102 had much less variance ranging from about 1150 to about 1275 A/min. This prospective example demonstrates that a closed control loop setting different gas flows with the gas distributor 134 having a combination of central and peripheral gas outlets 140, 142 can reduce etch rate variance and significantly improve etch rate uniformity across the substrate 102.

Figure 4:
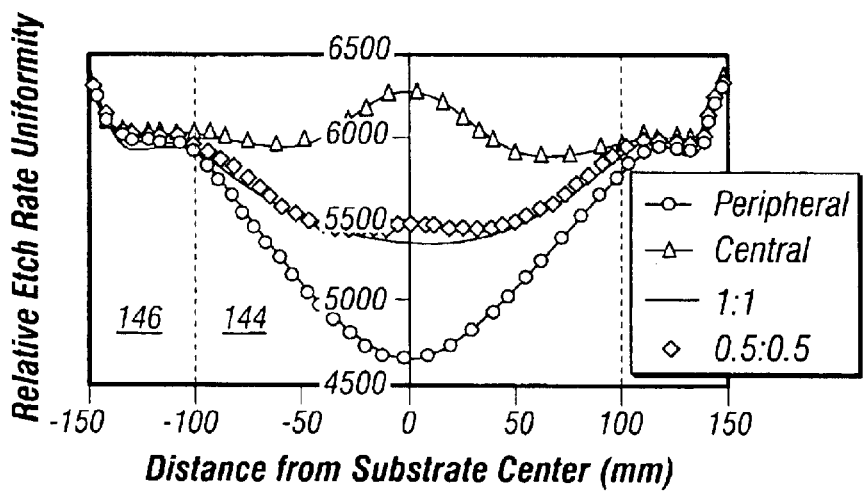
FIG. 4 is a graph of plots showing the relative etch rate uniformity achieved when etching gas is passed through only one or both of the central and peripheral gas outlets at different gas flow valve opening sizes.

FIG. 4 shows results in which the flow splitter 132 of a gas distributor 134 was set to provide gas flow from either only from (i) the peripheral outlets 142 or the (ii) central gas outlets 140, or both outlets 140, 142 either (iii) fully open (1:1) or (iv) both outlets 140, 142 open 50% (0.5:0.5). The central only gas flow pattern provided relatively higher etch rates of up to about 6200 angstroms/minute at the central region 144 and lower etch rates of about 5800 at the peripheral region 146 of the substrate 102, and a peripheral gas flow provided lower etch rates between about 4500 and 5000 angstroms/minute at the central region 144 and higher etch rates of about 6000 angstroms/minute at the peripheral region 146 of the substrate 102. Maintaining both the central and peripheral gas outlets 140,142 open provided etch rates that varied between 5200 and 6000 angstroms/minute. The etch ratio is a measure of a dimension such as thickness or depth of a feature 85.

Figure 5:
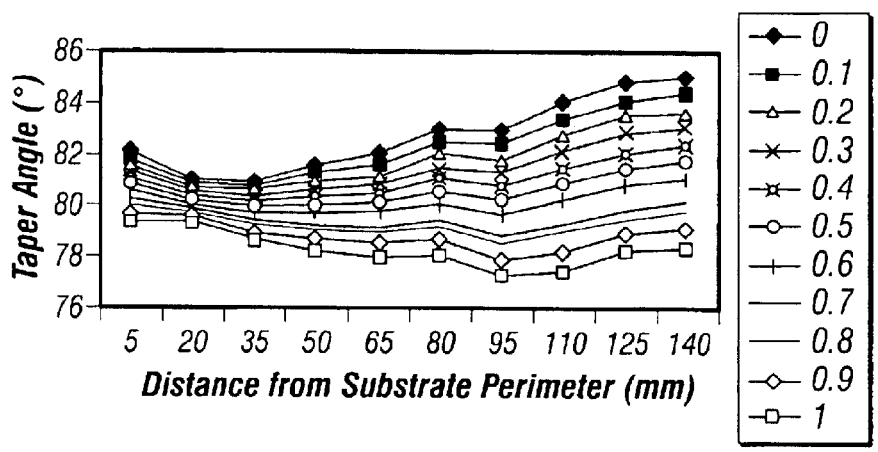
FIG. 5 is a graph of plots showing control of the variation of taper angles of etched features across the substrate by regulating the opening size of the central and peripheral gas outlets (0 is closed to 1 fully open peripheral gas outlet)

FIG. 5 demonstrates the predicted variation in another dimension, the taper angle of etched features 85, across a radial section from the peripheral region 146 to the central region 144 of the substrate 102 for increasing flow ratios of etching gas passed through the peripheral gas outlets 142 relative to the central gas outlets 140, where 0 indicates only central gas outlet flow and 1 indicates only peripheral gas flow. The taper angle of the etched features 85 was simulated across a radial section of features 85 having a line width of 0.18 microns, and that were relatively isolated from one another. These figures demonstrate that the taper angle of the etched features 85 is also significantly influenced by controlling the gas flow distribution by passing different flow ratios of etching gas through the central and peripheral gas outlets 140, 142. When the etching gas was passed only through the central gas outlets 140, the taper angle of the etched features 85 at the central region 144 of the substrate 102 exceeded 84° while the taper angle at the peripheral region 146 of the substrate 102 was closer to a desirable 82° angle. In contrast, when all the etching gas was passed through the peripheral gas outlets 142, the taper angles ranged on the lower side from 77 to less than 80°, and were higher at the peripheral region 146 than the central region 144. Good taper angle uniformities were obtained at peripheral to center gas flow ratio settings of from about 2:1 to about 4:1 and more preferably about 3:1. A similar pattern was predicted for the etching of features 85 in a feature-dense region of the substrate 102 (not shown).

Figure 6:
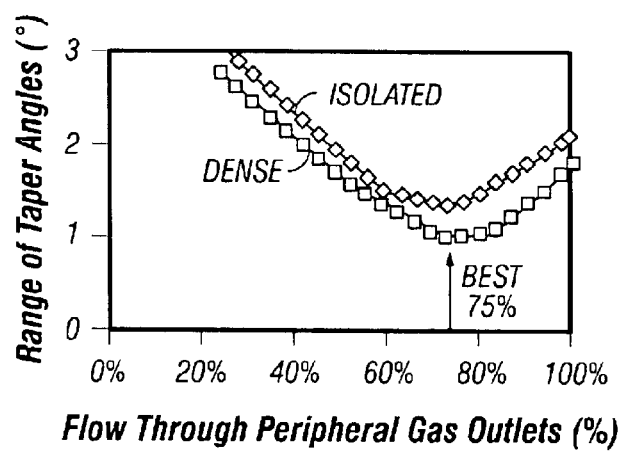
FIG. 6 is a graph of plots of the taper angle uniformity at different flow rates of etching gas passed through peripheral and central gas outlets for isolated and dense features.

FIG. 6 shows the predicted taper angle uniformity as a ratio of peripheral to central gas outlet flow rates and for etching of isolated and dense feature regions on the substrate 102, according to a taper etch simulation model. The optimal range of taper angles of about 1, which indicates the best taper angle uniformity, is the same for both the isolated and dense feature regions and is at a flow ratio of about 75 percent which corresponds to a 3:1 (75%) flow rate ratio of etching gas passed through the peripheral and central gas outlets 142, 140, respectively. At the 3:1 ratio, the lowest variability range of taper angles of the etched features 85 were obtained across the substrate 102.

Figure 7:
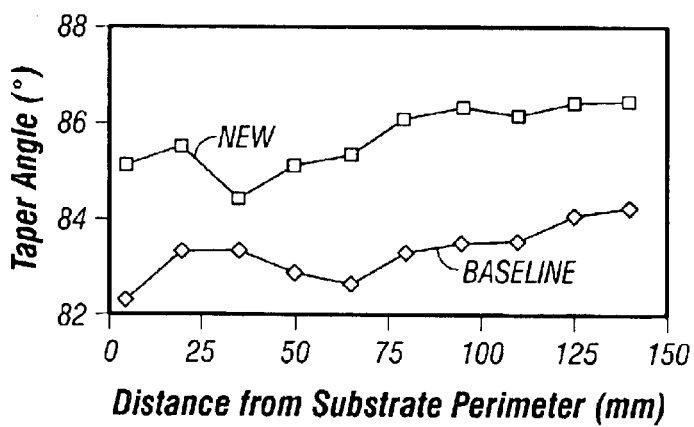
FIG. 7 shows the variation in feature taper angle from the center to a substrate perimeter for different etching gas compositions.

FIG. 7 shows a comparison of the measured taper angles of the etched features 85 located at different points across the radius of the substrate 102 for a new and baseline process. In this example, the gas distributor 122 in the chamber 104 comprises first, or central, gas outlets 140 oriented to direct etching gas has an angle of about 10° relative to the normal to the plane of the substrate 102, and second, or peripheral, gas outlets 142 oriented to direct the etching gas at an angle of 300 relative to the normal to the plane of the substrate 102. The gas outlets 140, 142 were drilled into a 10 inch diameter gas distributor 134 made from quartz. The taper angles for a 3:1 flow ratio process were found to increase to the range of 84 to 86° instead of the 82 to 84° range provided by a baseline process. The increase in average taper angle represented a 1 to 5° increase in taper angle over the baseline process. The range of taper angles is also narrower at about 2 to 2.5°, especially when considering the increased taper angle values, which should exhibit a higher variation rather than a lower one. The average depth of the etched features 85 also increased from about 2800 to about 2900 angstroms, while reducing the 1σ statistical deviation to from 44 to 69. These results represented a significant improvement over baseline processes that provided lower average taper angles and higher ranges of variations in taper angles for features 85 at different regions 144, 146 across the substrate 102.

Controlling Magnetic Field Strengths to Regulate Feature Dimensions

The process monitoring signals from different regions 144, 146 of the substrate 102 can also be used to control the processing of features 85 at the different regions by setting different levels of, or multivariate intensity levels, of a magnetic field strength across the different processing sectors 136, 138 of the process zone 112. When the magnetic field generator 170 is present, the chamber controller 300 comprises a magnetic field control instruction set 392 to control the magnetic field strengths at localized processing sectors 136, 138 in the chamber 104. For example, the magnetic field control instruction set 392 can provide instructions to the magnetic field generator 170 to generate a magnetic field having different controllable first and second field strengths in each processing sectors 136, 138 so that the first and second regions 144, 146 of the substrate 102 are each exposed to a different magnetic field strength. The process feedback control instruction set 388 evaluates the signals from the process monitor instruction set 384 and sends instructions to the magnetic field control instruction set 392 to operate the magnetic field generator 170 to set different magnetic field strengths in relation to the evaluated signals. The variable magnetic field may be used to control plasma sheath density above different regions 144, 146 of the substrate 102, stir up the plasma ions by applying a rotating or changing magnetic field, or contain the plasma and reduce spreading of plasma into the exhaust port 158. Each magnetic field strength can be independently controllable so that each may be adjusted to have a particular strength value at a particular region 144, 146 of the substrate 102. However, if the difference between the two magnetic field strengths is constant for a particular process, then the magnetic field generator 170 can use a process recipe that sets a magnetic field to two fixed field strengths at two different positions in the chamber 104, for example, a first fixed field strength above the central region 144 of the substrate 102 and a second fixed field strength above the peripheral region 146 of the substrate 102.

The different magnetic field strengths control the passage or motion of the plasma species at different regions 144, 146 of the substrate 102 to control processing characteristics at these different regions. For example, to match the attributes of features 85 being etched at the central and peripheral regions 144, 146 of the substrate 102, a first magnetic field strength can be applied about a second radially peripheral region 146 of the substrate 102 that is higher than a second field strength about a first central region 144 of the substrate 102, by for example, at least about 20%, or even at least about 40%. The magnetic field strength at the different regions 144, 146 can also be set to provide increased stirring of the plasma ions at outer region 146 relative to the inner region 144, or vice versa, by adjusting the frequency of the current applied to magnetic field generator 170.

An exemplary version of a magnetic field generator 170 on a chamber 104a, such as for example, an MxP+ or eMax type chamber from Applied Materials, Inc., Santa Clara, Calif., is shown in FIGS. 1f and 1g. The magnetic field generator 170 generates a controllable magnetic field in the processing sector 112 of the chamber 104a. The magnetic field generator 170 can comprise permanent magnets or electromagnets, as for example described in U.S. Pat. No. 4,842,683, issued Jun. 27, 1989, which is incorporated herein by reference in its entirety. In one embodiment, illustrated in FIG. 1f, the magnetic field generator 170 comprises an assembly of concentric pairs of electromagnets 202a–h that control the radial spatial density distribution of the plasma while generating a rotating magnetic field that is parallel to the plane of the substrate 102. The rotating magnetic field has an angular orientation and magnitude that varies over time and is the vector sum of the magnetic fields produced by each electromagnet 202a–h. One pair of electromagnets 200a,b comprises two electromagnets 200a,b that are concentric and co-planar to generate a magnetic field with independent central and peripheral field strengths. The concentric electromagnets 202a–h are positioned adjacent to the chamber 104a and are powered by an electromagnet power source 204 comprising independent power supplies 202a–h that are adjusted by the chamber controller 300 to independently control the currents applied to the electromagnets 200a–h to independently control the central and peripheral field strengths. The electromagnet power source 204 also energizes the electromagnet pairs in a sequence to generate a rotating, multi-directional magnetic field.

The electromagnets 200a–h are arranged to generate first and second magnetic field strength vectors $B_p$, $B_c$ in different etching zones 136, 138 in the chamber 104a. Each magnetic field strength vector $B_p$, $B_c$ has mutually perpendicular magnetic vectors $B_x$ and $B_y$, respectively, which are generally parallel to the substrate receiving surface 116, as disclosed in commonly held U.S. Pat. No. 5,215,619, which is incorporated herein by reference in its entirety. The magnetic power source 204 has a number of conventional electromagnet power systems 202a–h to control the magnitudes and directions of the currents supplied to the electromagnets 200a–h according to instructions provided by the chamber controller 300. The associated currents determine the orientation and magnitude of the magnetic field generated by each coil pair. Alternatively, the chamber controller 300 can control oscillatory movement of a set of permanent magnets of ferromagnetic material positioned in an armature that can be rotated in a circular/elliptical form or oscillated in a linear direction. The perpendicular field vectors $B_y$ and $B_x$ generated by the electromagnetic field generator 170 are defined by the functions $B_x = B \cos \theta$; and $B_y = B \sin \theta$. Given the desired set of values of the field, B, and its angular orientation θ, the equations can be solved to obtain the associated magnetic field vectors $B_y$ and $B_x$ which provide the desired strength of field and orientation in each etching zone 136, 138.

Moreover, the angular orientation and magnitude of the rotating magnetic field can be independently altered as quickly or as slowly as desired by changing the current in the electromagnets 200a–h or by rotational movement of the magnets. The chamber controller 300 is used to vary the time that the magnetic field is at each angular position, the direction of the angular stepping function, and the field intensity. Thus the magnetic field can be stepped around the substrate 102 using selected orientation and time increments. If desired, the magnitude of the resultant field $B_\theta$ can be changed if the process conditions or chamber configuration require a constant field strength. Preferably, the magnetic field is rotated at a slow rate of 2 to 5 seconds/revolution, by sequentially changing the currents to the electromagnets 200a–h or rotating the permanent magnets. This steps the magnetic fields applied about the different regions 144, 146 of the substrate 102 at a slow rate and increases etch uniformity around the substrate 102, rather than in one direction across the substrate 102. The rotating magnetic field above the substrate 102 increases the circulation and stirring of the charged plasma species above the substrate 102.

The variation of etch rate at the central and peripheral regions 144, 146 of the substrate 102 as a function of the strength of the magnetic field applied by the magnetic field generator 170 in an etching process is illustrated in FIG. 9. The curve 197 (denoted by squares) indicates the etch rate at the peripheral region 146 for different magnetic field strengths, while the curve 198 (denoted by diamonds) indicates the etch rate at the central region 144. In the absence of an applied magnetic field, the centrally located feature etch rates are higher than the feature etch rates at the peripheral portions of the substrate 102. However, as the magnetic field strength is increased, at about 10 Gauss the peripheral etch rates becomes dominant over the central etch rate. At about 27 Gauss there is a local maximum in the central etch rate, and at about 42 Gauss there is a local maximum in the peripheral etch rate and also a locally maximized disparity between the central and peripheral etch rates. Good etch uniformity is provide where the two curves intersect at an applied magnetic field having a strength of about 10 Gauss. This graph demonstrates the control over the etched features 85 that may be achieved using controllable magnetic field strengths from a magnetic field generator 170.

Alternatively, as illustrated in FIG. 1g, the electromagnets 200i,j can be arranged to provide a magnetic field that is substantially orthogonal to the plane of the substrate 102 while controlling the radial spatial density distribution of the plasma. Typically, the magnetic field generator 170 produces a magnetic field having a high strength at or outside the periphery of the substrate 102 to contain the plasma above the substrate 102. As shown in FIG. 1g, when an ion 201 attempts to leave the containment region with a radially outward velocity, the increasing magnetic field results in an ExB force that pulls the ion 201 in a circuitous path back into the containment region. The magnetic field generator 170 may comprise one or more electromagnets 200i,j that are substantially radially symmetric about the process chamber 104. For example, the electromagnets may be radially concentric within the same or different planes. Currents are independently applied to the electromagnets 200i,j by field generation power supplies 202i,j that are independently controlled by the chamber controller 300. These independent currents may be controlled to have varying magnitude or direction to generate a magnetic field that desirably shapes the radial spatial density distribution of the plasma.

The chamber controller 300 adjusts the power supplies 202i,j to generate a magnetic field with a desirable vector field pattern in response to data from the process monitor 180 within a closed feedback loop. For example, the chamber controller 300 may initially generate a default magnetic field that is selected to produce a reliable plasma density distribution. The process monitor 180 transmits feedback data to the chamber controller 300 indicating processing attributes as a function of radius. The process monitor 180 may indicate that the processing attributes are occurring desirably across the substrate 102 as a function of radius, and the chamber controller 300 may respond by maintaining the magnetic field in a quiescent state. Alternatively, the process monitor 180 may indicate that the processing attributes are deviating from what has been preselected as the desired pattern, and in response the chamber controller 300 can adjust the power supplies 202i,j to correct for the deviation.

The chamber controller 300 may compensate for past deviations from the desired state by overadjusting the magnetic field in the future to obtain an integrated attribute pattern over time that is desired. For example, when etching the substrate 102, it may be desirable to obtain a preselected radial net etch distribution at the end of the etch process. If the process temporarily deviates from the desired distribution, the chamber controller 300 compensates in real-time by adjusting the magnetic field to temporarily produce an inverse of the desired distribution. For example, a deviation over a time interval may be corrected by an inverse deviation over the same interval, or sometimes more preferably, by a more pronounced inverse deviation over a shorter time interval, before the chamber controller 300 returns the magnetic field to the desired quiescent state.

In one exemplary embodiment, as illustrated in FIG. 19, the magnetic field generator 170 comprises two concentric electromagnets 200$i,j$. According to the magnitudes and directions of the currents applied to these electromagnets 200$i,j$, different magnetic field strengths result orthogonal to the surface of the substrate 102. Three exemplary curves of resultant magnetic field magnitudes as a function of radius across the substrate 102 are shown in FIGS. 8$a$–$c$ for the purposes of illustration. FIG. 8$a$ shows an exemplary magnetic field magnitude that results when a current is run through the outer electromagnet 200$i$ while substantially no current is run through the inner electromagnet 200$j$. The process gas is typically contained in the "valleys" of the curves, where the second derivative of the curve is positive. For example, in this embodiment the plasma is contained within a disc-shaped region above the central region 136 of the substrate 102. FIG. 8$b$ shows an exemplary magnetic field magnitude that results when currents are run through both the inner and outer electromagnets 200$i,j$ in the same direction. Here, the plasma is contained in a thin annulus about the peripheral region 138 of the substrate 102 as well as a disc-shaped region about the central region 136 of the substrate 102. Finally, FIG. 8$c$ shows an exemplary magnetic field magnitude that results when currents are run through the inner and outer electromagnets 200$i,j$ in opposite directions. In this case, the plasma is contained in a thick annulus about the peripheral region 138 of the substrate 102. Thus, the radial density distribution of the plasma is controlled by controlling the magnetic field as a function of radius.

Returning to FIG. 1$b$, the chamber controller 300 may adjust the gas distributor 134 and the magnetic field generator 170 in tandem to produce an overall flow pattern and radial density distribution of the plasma that is desirable. For example, the chamber controller 300 may comprise a lookup table 394, shown in FIG. 2$b$, that is indexed according to the gas flow rate settings and electromagnetic current settings to efficiently shape the plasma flow and distribution. The lookup table 394 may be further indexed according to a present field state of the plasma such that a desired field state of the plasma can be achieved. In one exemplary situation, it is desirable to rapidly alter the flow of the plasma from a present field state to a desired field state. Although it may be possible to control the exhaust throttle valve 163 and gas distributor 134 to eventually achieve the desired field state, the chamber controller 300 may also rapidly alter the magnetic field in the processing sector 112 to re-arrange the plasma distribution and achieve the desired field state more quickly and with reduced expenditure of process gas.

Controlling Gas Energizing Power Levels to Regulate Feature Dimensions

The chamber controller 300 also comprises program code that includes a gas energizer control instruction set 380 to control the induction field at localized process regions in the chamber 104. For example, the gas energizer control instruction set 380 can provide instructions to the different coils 179$a,b$ of the antenna 174 to generate an induction field having a controllable first and second strengths about first and second regions 144, 146 of the substrate 102, respectively. The process feedback control instruction set 388 evaluates signals from the process monitor instruction set 384, and send instructions to the gas energizer control instruction set 380 to independently operate the coils 179$a,b$ of the antenna 174 to set different field strengths in relation to the signals. Each induction field strength can be independently controllable so that each may be adjusted to have a particular strength value that is needed at that region of the substrate 102. In addition, the gas energizer control instruction set 380 may also use a process recipe that operates the antenna 174 at a single power level that generates the desired induction field strengths across the substrate 102 to provide more uniform or consistent etching of the features 85 across the substrate 102.

The following example demonstrates the effect of the source power level of the current applied to the inductor coils 179$a,b$ of an antenna 174 in a DPS-type chamber illustrated in FIG. 1$c$. FIG. 10 shows the effect of different source power levels applied to the antenna on the variation in feature etch rates from the central 144 to the peripheral region 146 of the substrate 102. Decreasing the source power reduced the variation in feature etch rates from 4500–6000 angstroms/minute at 800 Watts to 5000–5500 angstroms/minute at 550 Watts. This represented a threefold reduction in feature etch rate variation of from Δ1500 to Δ500 angstroms/minute. Thus, setting a particular or different source power levels at the central and peripheral regions 136, 138 of the substrate 102 can also be used to further enhance etching uniformity for the fine features 85 across the substrate 102.

Controlling Substrate Zone Temperatures to Regulate Feature Processing

In one version, the chamber controller operates the chamber to maintain different temperatures in the different regions of the substrate. For example, the chamber can have radiative heating elements (not shown), such as infra-red lamps or resistive wires, that are arranged in concentric circles, directly above or below the substrate support 114. Each set of concentric lamps, or each coil of resistive wire, is separately independently powered to control the temperatures generated by them. In this manner, the chamber controller can generate different temperatures within each of the processing zones. For example, annular temperature circles can be generated within each concentric processing zone to control processing rates of the features 85 exposed to the different zones.

In one version, the support 114 has multiple temperature control zones. For example, the support 114 can have dual concentric zones that each independently receive and maintain heat transfer gas in radially inner and outer regions across the backside of the substrate 102. For example, as illustrated in FIGS. 1$h,i$, the receiving surface 116 of the support 114 may comprise at least one gas inlet port 115 to supply heat transfer gas below the substrate 102 and at least one gas exhaust port 117 to exhaust or recycle the heat transfer gas. In the version shown in FIGS. 1$h,i$, the gas inlet port 115 comprises a plurality of inlet ports 115 concentrically arranged about the gas exhaust port 117 located at the center of the support 114. The gas inlet ports 115 introduce heat transfer gas into the volume of space defined between the back of the substrate 102 and the receiving surface 116 of the support 114. The gas inlet ports 115 supply a heat transfer gas such as a non-reactive gas, for example helium or nitrogen. The heat transfer gas introduced by the gas inlet ports 115 travels across the receiving surface 116 to the gas exhaust port 117 via a path of minimum hydrodynamic flow resistance.

The flow resistance along the pathway traveled by the heat transfer gas determines the difference in pressure of heat transfer gas between each of the zones 125a, 125b on either end of the pathway. The hydrodynamic flow resistance between the gas inlet port 115 and exhaust port 117 is controlled by providing a non-sealing protrusion 119 that is around and at least partially encircles either the gas inlet port 115 (not shown) or the gas exhaust port 117 (as shown) to serve as a gas barrier that impedes or reduces the flow of gas between the gas inlet port 115 and the gas exhaust port 117. The non-sealing protrusion 119 does not form an impermeable or gas-tight seal with the overlying substrate 102. The shape of the non-sealing protrusion 119 is selected to obtain the desired hydrodynamic flow resistance across a selected portion of the receiving surface 116.

Increased hydrodynamic flow resistance across a portion of the receiving surface 116 results in an increased gas pressure in the zone 125b and reduced gas pressure occurs in a zone 125a. Higher gas pressure results in higher heat transfer rates from the substrate 102 and lower gas pressure results in lower heat transfer rates. The support 114 also comprises a sealing protrusion 123 that extends around the periphery of the support 114 below the peripheral portion of the substrate 102 to contact and to form a substantially gas-tight seal with the substrate 102 to reduce leakage of the heat transfer gas into the chamber 104. Optionally, the temperatures of the substrate backside at these two regions may also be monitored, and a thermostat (not shown) may regulate the heat transfer gas flow to achieve a desired temperature distribution across the substrate backside.

Although the present invention has been described in considerable detail with regard to certain preferred versions thereof, other versions are possible. For example, the apparatus of the present invention can be used for other chambers and for other processes, such as deposition to form the features 85 on the substrate 102. Therefore, the appended claims should not be limited to the description of the preferred versions contained herein.

What is claimed is:

1. A substrate processing apparatus comprising:
   (a) a process chamber comprising:
      (i) a substrate support to receive a substrate, the substrate having first and second regions;
      (ii) a gas distributor to introduce a gas into the chamber;
      (iii) a gas energizer to energize the gas to form features on the substrate; and
      (iv) a gas exhaust port to exhaust the gas;
   (b) a process monitor to:
      (i) monitor a dimension of a pattern of spaced apart and discrete features being formed in the first region of the substrate and generate a first signal; and
      (ii) monitor a dimension of a pattern of spaced apart and discrete features being formed in the second region of the substrate and generate a second signal; and
   (c) a chamber controller to receive the first and second signals and operate the substrate support, gas distributor, gas energizer, or gas exhaust port, to set process parameters comprising one or more of a gas flow rate, gas pressure, gas energizing power level, and substrate temperature, to process the features in the first and second regions to compensate for any differences in the dimensions of the features being formed in the first and second regions.

2. An apparatus according to claim 1 wherein the chamber controller comprises program code to select and set process parameters to process the features in the first region at a first processing rate and to simultaneously process the features in the second region at a second processing rate, such that at the termination of processing, the dimensions of the features in the first region are substantially identical to the dimensions of the features in the second region.

3. An apparatus according to claim 1 wherein the chamber comprises a first processing sector about the first region of the substrate and a second processing sector about the second region of the substrate, and wherein the chamber controller comprises program code to select and set a process parameter at a controllable first level in the first processing sector and at a controllable second level in the second processing sector.

4. An apparatus according to claim 3 wherein the chamber controller comprises program code to set the process parameter at the controllable first level directly in proportion to the magnitude of the first signal and sets the process parameter at the controllable second level directly in proportion to the magnitude of the second signal.

5. An apparatus according to claim 3 wherein the chamber controller comprises program code to operate the gas distributor to set a gas flow rate at a first flow rate in the first processing sector and a second flow rate in the second processing sector.

6. An apparatus according to claim 3 wherein the chamber controller comprises program code to operate the gas energizer to set a gas energizing power level at a first power level about the first processing sector and at a second power level about the second processing sector.

7. An apparatus according to claim 3 wherein the chamber further comprises a magnetic field generator to apply a magnetic field within the chamber, and wherein the chamber controller comprises program code to operate the magnetic field generator to set a controllable magnetic field strength at a first field strength about the first processing sector and at a second field strength about the second processing sector.

8. An apparatus according to claim 1 wherein the chamber controller selects a process recipe from a look-up table stored in a memory of the controller in response to the first and second signals, the look-up table containing a plurality of process recipes, each selected process recipe being related to a pair of first and second signals or a mathematical operand of a pair of first and second signals.

9. An apparatus according to claim 1 wherein the chamber controller comprises program code to change the process parameters in the chamber from initializing process parameters used in the processing of an initial substrate, to batch process parameters for the processing of a batch of substrates similar in attributes to the initial substrate.

10. An apparatus according to claim 1 wherein features being formed on the substrate comprise a principal orientation, and wherein the process monitor comprises a first interferometer to detect light reflected from the features being formed in the first region of the substrate to generate the first signal, and a second interferometer to detect light reflected from the features being formed in the second region of the substrate to generate the second signal.

11. A substrate processing method comprising:
   (a) placing a substrate in a process zone, the substrate having first and second regions;
   (b) introducing a process gas into the process zone;
   (c) energizing the process gas to form a pattern of spaced apart and discrete features on the substrate;
   (d) exhausting the process gas;

(e) monitoring a dimension of a pattern of spaced apart and discrete features being formed in the first region of the substrate and generating a first signal; and (f) monitoring a dimension of a pattern of spaced apart and discrete features being formed in the second region of the substrate and generating a second signal; and (g) evaluating the first and second signals and setting process parameters in the process zone to process the features in the first and second regions to compensate for any differences in the dimensions of the features, the process parameters comprising one or more of a gas flow rate, gas pressure, gas energizing power level, and substrate temperature.

12. A method according to claim 11 comprising setting the process parameters in the process zone to process the features in the first region at a first processing rate and to simultaneously process the features in the second region at a second processing rate so that at the termination of processing, the dimensions of the features in the first region are substantially identical to the dimensions of the features in the second region.

13. A method according to claim 11 wherein the process zone comprises a first processing sector about the first region of the substrate and a second processing sector about the second region of the substrate, and the method comprises setting a process parameter at a controllable first level in the first processing sector and at a controllable second level in the second processing sector.

14. A method according to claim 13 comprising setting the process parameter at the controllable first level directly in proportion to the magnitude of the first signal and setting the process parameter at the controllable second level directly in proportion to the magnitude of the second signal.

15. A method according to claim 13 comprising setting a gas flow rate at a first flow rate in the first processing sector and a second flow rate in the second processing sector.

16. A method according to claim 13 comprising setting a gas energizing power level at a first power level in the first processing sector and at a second power level in the second processing sector.

17. A method according to claim 13 comprising setting a controllable magnetic field strength at a first field strength about the first processing sector and at a second field strength about the second processing sector.

18. A method according to claim 11 comprising changing process parameters in the chamber from initializing process parameters used in the processing of an initial substrate, to batch process parameters for the processing of a batch of substrates similar in attributes to the initial substrate.

19. A method according to claim 11 comprising detecting light reflected from the first region of the substrate to generate the first signal and detecting light reflected from the second region of the substrate to generate the second signal.

* * * * *